(12) United States Patent
Kim et al.

(10) Patent No.: US 9,391,238 B2
(45) Date of Patent: Jul. 12, 2016

(54) SEMICONDUCTOR LIGHT-EMITTING DEVICE

(71) Applicant: SAMSUNG ELECTRONICS CO., LTD., Suwon-si, Gyeonggi-do (KR)

(72) Inventors: Tae-Hun Kim, Anyang-si (KR); Seung-Hwan Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/145,153

(22) Filed: Dec. 31, 2013

(65) Prior Publication Data
US 2014/0209955 A1    Jul. 31, 2014

(30) Foreign Application Priority Data
Jan. 29, 2013 (KR) .................. 10-2013-0010101

(51) Int. Cl.
| | |
|---|---|
| *H01L 33/00* | (2010.01) |
| *H01L 27/32* | (2006.01) |
| *H01L 33/08* | (2010.01) |
| *H01L 33/38* | (2010.01) |
| *H01L 33/62* | (2010.01) |
| *H01L 33/20* | (2010.01) |
| *H01L 33/22* | (2010.01) |
| *H01L 33/44* | (2010.01) |

(52) U.S. Cl.
CPC ............ *H01L 33/38* (2013.01); *H01L 33/62* (2013.01); *H01L 33/20* (2013.01); *H01L 33/22* (2013.01); *H01L 33/44* (2013.01); *H01L 2924/0002* (2013.01); *H01L 2933/0016* (2013.01)

(58) Field of Classification Search
CPC ....................................................... H01L 33/00
See application file for complete search history.

(56) References Cited

U.S. PATENT DOCUMENTS

| | | | |
|---|---|---|---|
| 5,681,757 A | 10/1997 | Hayes | |
| 6,903,381 B2 | 6/2005 | Lin et al. | |
| 2009/0085052 A1 | 4/2009 | Ko et al. | |
| 2011/0147779 A1 | 6/2011 | Kang et al. | |
| 2011/0291143 A1 | 12/2011 | Kim et al. | |
| 2012/0007101 A1* | 1/2012 | Yang et al. | 257/76 |
| 2012/0061727 A1 | 3/2012 | Lee et al. | |
| 2012/0196396 A1 | 8/2012 | Kuo et al. | |

FOREIGN PATENT DOCUMENTS

| | | |
|---|---|---|
| KR | 1020030084513 | 11/2003 |
| KR | 1020070063976 | 6/2007 |
| KR | 1020110104817 | 9/2011 |
| KR | 1020120044739 | 5/2012 |

* cited by examiner

*Primary Examiner* — Mohammad Choudhry
(74) *Attorney, Agent, or Firm* — F. Chau & Associates, LLC

(57) ABSTRACT

A semiconductor light-emitting device includes a light-emitting structure that includes a first conductive semiconductor layer, an active layer, a second conductive semiconductor layer, an electrode layer contacting one of the first conductive semiconductor layer and the second conductive semiconductor layer, and a bonding conductive layer connected to the electrode layer. The bonding conductive layer includes a main bonding layer having a recess area defined by a stepped portion on a surface opposite to a surface facing the electrode layer, and a filling bonding layer filling at least a part of the recess area.

18 Claims, 12 Drawing Sheets

SEMICONDUCTOR LIGHT-EMITTING DEVICE

CROSS-REFERENCE TO RELATED APPLICATIONS

This application claims priority to Korean Patent Application No. 10-2013-0010101, filed on Jan. 29, 2013 the disclosure of which is hereby incorporated by reference herein in its entirety.

(I) Technical Field

The present disclosure relates to a semiconductor light-emitting device, and more particularly, to a semiconductor light-emitting device that is mounted on a package substrate by using flip-chip technology.

(II) Discussion of the Related Art

Light-emitting diodes (LEDs) using a nitride semiconductor (nitride semiconductor light-emitting devices) are widely used in various light sources such as, for example, lighting devices, signal lamps, and large display devices used for backlighting. As the light-emitting diode (LED) market for illumination has expanded and products having high reliability, high efficiency, and high output may be required, a flip-chip bonding technology using eutectic die bonding, which is a high heat dissipation bonding method, has often been used as a method of mounting a nitride semiconductor light-emitting device on a package substrate. After the semiconductor light-emitting device is bonded to the package substrate by using the eutectic die bonding, undesired empty spaces may remain between the semiconductor light-emitting device and the package substrate due to stepped portions on the semiconductor light-emitting device. The undesired empty spaces may reduce heat resistance and the reliability of the semiconductor light-emitting device.

SUMMARY

Exemplary embodiments of the inventive concept provides a semiconductor light-emitting device which may increase heat resistance and the reliability of the semiconductor light-emitting device by minimizing empty spaces remaining between a package substrate and the semiconductor light-emitting device on which stepped portions are formed.

According to an exemplary embodiment of the inventive concept, there is provided a semiconductor light-emitting device including: a light-emitting structure that includes a first conductive semiconductor layer, an active layer, and a second conductive semiconductor layer; an electrode layer contacting one of the first conductive semiconductor layer and the second conductive semiconductor layer and a bonding conductive layer connected to the electrode layer, in which the bonding conductive layer includes: a main bonding layer having a recess area defined by a stepped portion on a surface opposite to a surface facing the electrode layer and a filling bonding layer filling at least a part of the recess area.

The main bonding layer and the filling bonding layer may include different materials. Alternatively, the main bonding layer and the filling bonding layer may include the same material as each other.

The main bonding layer and the filling bonding layer may have substantially flat surfaces extending on a same plane and opposite to surfaces facing the electrode layer.

The semiconductor light-emitting device may further include a conductive barrier layer disposed between the main bonding layer and the filling bonding layer in the recess area.

The semiconductor light-emitting device may further include a filling insulating layer covering a part of the bonding conductive layer on a same level as the bonding conductive layer.

According to an exemplary embodiment of the inventive concept, there is provided a semiconductor light-emitting device including: a package substrate, a first conductive semiconductor layer including grooves disposed in a surface facing the package substrate such that a plurality of mesa areas having a plurality of branching portions spaced apart from one another are defined, an active layer disposed on the plurality of mesa areas, a second conductive semiconductor layer disposed on the active layer, a first electrode layer connected to the second conductive semiconductor layer, on the plurality of mesa areas, a second electrode layer connected to the first conductive semiconductor layer on bottom surfaces of the grooves, and a bonding conductive layer disposed between the package substrate and at least one of the first electrode layer and the second electrode layer, in which the bonding conductive layer includes: a main bonding layer having a contact surface contacting the at least one electrode layer, a mount surface opposite to the contact surface, and at least one recess area defined by stepped portions in the mount surface and a filling bonding layer that fills the at least one recess area.

The at least one electrode layer may include the second electrode layer, and in which the second electrode layer includes a plurality of contact areas contacting the main bonding layer.

The at least one recess area may include a plurality of recess areas disposed to correspond to the plurality of contact areas of the second electrode layer, and in which the filling bonding layer is formed in each of a plurality of spaces defined by the package substrate and the plurality of recess areas.

The main bonding layer may include a first portion covering a part of the first electrode layer with an insulating layer therebetween, and a second portion contacting the second electrode layer and covering the second electrode layer, and the filling bonding layer may be disposed vertically overlapping with the second electrode layer.

The package substrate may include a first conductive layer and a second conductive layer spaced apart from each other, and in which each of the main bonding layer and the filling bonding layer contacts any one of the first conductive layer and the second conductive layer.

The semiconductor light-emitting device may further include a conductive barrier layer disposed between the main bonding layer and the filling bonding layer in the at least one recess area, and in which the conductive barrier layer includes a portion contacting the package substrate.

In accordance with an exemplary embodiment, a semiconductor light-emitting device is provided. The semiconductor light-emitting device includes a substrate having an uneven pattern disposed on a first surface thereof, a first conductive semiconductor layer disposed on the uneven pattern on the first surface of the substrate, in which the first conductive semiconductor layer includes a plurality of grooves therein, a first mesa area that constitutes part of a first mesa structure, and a plurality of second mesa areas constituting a plurality of second mesa structures branching from the first mesa structure and in which the second mesa areas have a plurality of branching portions which are spaced apart from one another by the grooves disposed therebetween, an active layer disposed on the first mesa area and the second mesa areas, a second conductive semiconductor layer disposed on the active layer, a first electrode layer connected to the second conductive semiconductor layer and overlapping with first mesa area and the second mesa areas, a second electrode layer extending in a longitudinal direction of the grooves on bottom surfaces of the grooves in which the second electrode layer includes a plurality of contacts disposed on the bottom surfaces of the grooves which connect the second electrode layer to the first conductive semiconductor layer, a first insulating layer covering sidewalls of the first mesa structure and the second mesa structures branching from the first mesa structure, and a second insulating layer covering the sidewalls of the first mesa structure and the second mesa structures branching from the first mesa structure with the first insulating layer therebetween and covering a non-contact area of the first electrode layer.

In addition, the semiconductor light-emitting device further includes a first bonding conductive layer disposed on the first electrode layer and overlapping with the first mesa structure and connected to the first electrode layer via a contact area of the first electrode layer, in which the first bonding conductive layer includes a first main bonding layer having a first recess area therein defined by a stepped portion in a surface opposite to a contact surface of the first main bonding layer contacting the first electrode layer, and a first filling bonding layer filling in the first recess area of the first main bonding layer and a second bonding conductive layer disposed on the second electrode layer and connected to the second electrode layer through the plurality of contacts of the second electrode layer, in which the second bonding conductive layer includes a second main bonding layer having a plurality of second recess areas disposed in a surface opposite to a surface facing the second electrode layer and defined by a stepped portion of the second mesa structures, and a plurality of second filling bond layers filling the second recess areas.

BRIEF DESCRIPTION OF THE DRAWINGS

Exemplary embodiments of the inventive concept can be more clearly understood from the following detailed description taken in conjunction with the accompanying drawings in which.

DETAILED DESCRIPTION OF EXEMPLARY EMBODIMENTS

Figure 1A:
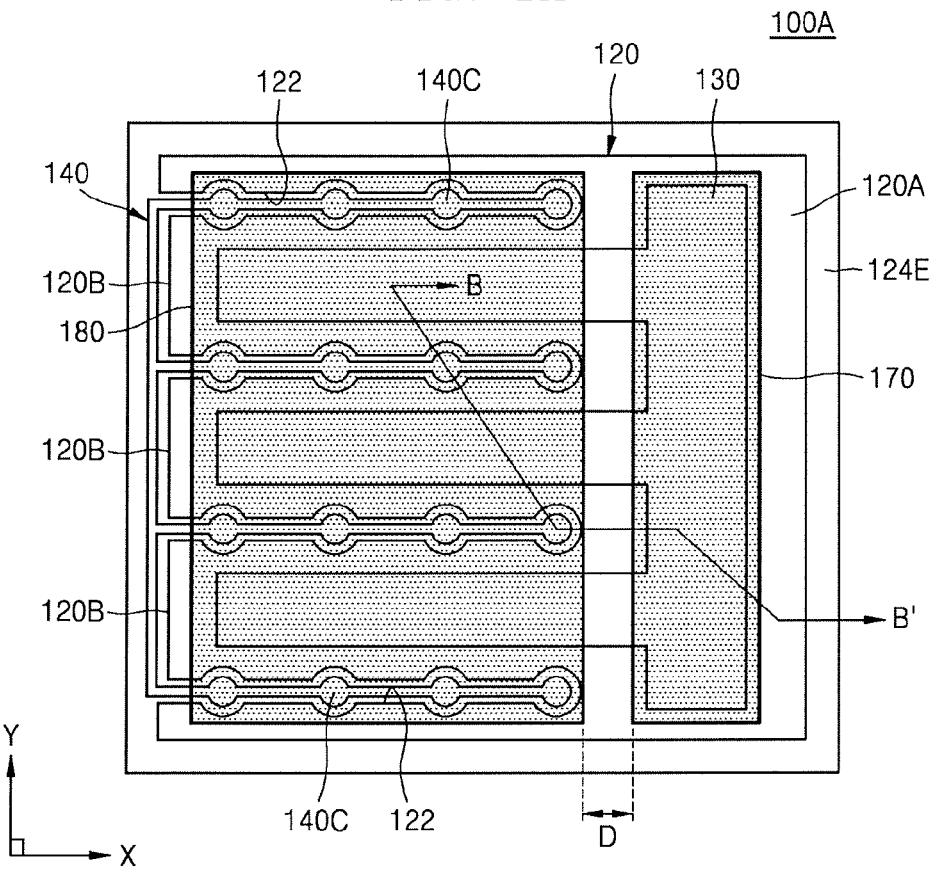
FIG. 1A is a planar layout illustrating major elements of a semiconductor light-emitting device according to an embodiment of the inventive concept.

Exemplary embodiments of the inventive concept will now be described more fully with reference to the accompanying drawings, in which exemplary embodiments of the invention are shown. Exemplary embodiments of the invention may, however, be embodied in many different forms and should not be construed as being limited to embodiments set forth herein.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise.

In addition, as used herein, the term "and/or" includes any and all combinations of one or more of the associated listed items.

In the drawings, the same elements are denoted by the same reference numerals and a repeated explanation thereof will not be given. Also, in the drawings, the size and relative sizes of layers and regions may be exaggerated for clarity.

FIG. 1A is a planar layout illustrating major elements of a semiconductor light-emitting device 100A according to an embodiment of the inventive concept.

Figure 1B:
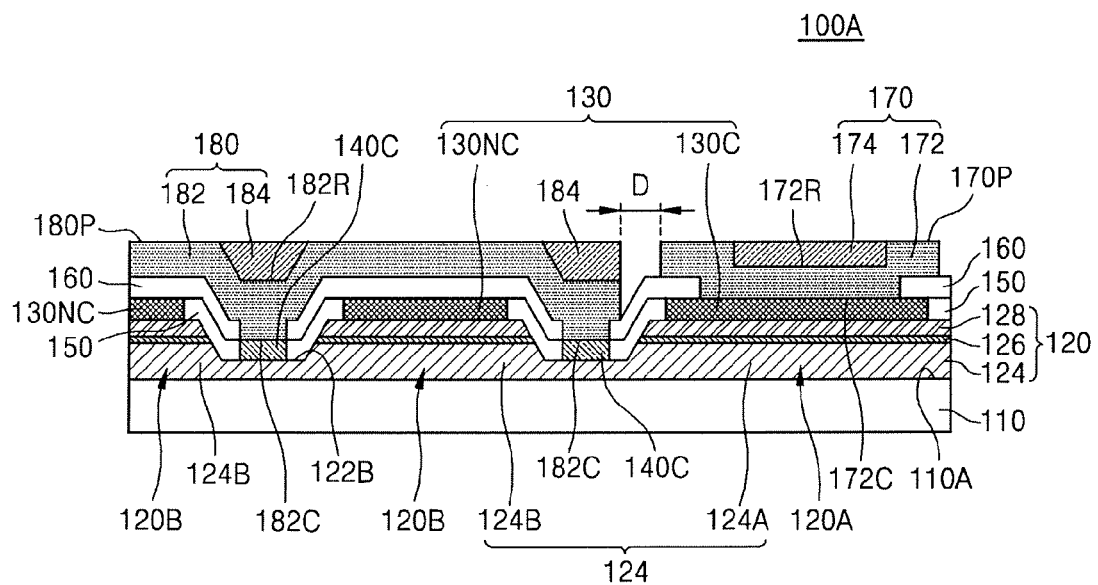
FIG. 1B is a cross-sectional view taken along line B-B' of FIG. 1A.

FIG. 1B is a cross-sectional view taken along line B-B' of FIG. 1A.

Referring to FIGS. 1A and 1B, the semiconductor light-emitting device 100A includes, for example, a substrate 110, and a light-emitting structure 120 that is formed on the substrate 110.

The substrate 110 may be formed of, but is not limited to, sapphire, silicon carbide (SiC), magnesium aluminate (MgAl$_2$O$_4$), gallium oxide (Ga$_2$O$_3$), magnesium oxide (MgO), lithium aluminate (LiAlO$_2$), lithium gallate (LiGaO$_2$), or gallium nitride (GaN). The substrate 110 may be, for example, a transparent substrate.

A plurality of grooves 122 are formed in a portion of the light-emitting structure 120. The light-emitting structure 120 includes, for example, a first mesa structure 120A that extends in a first direction (Y direction in FIG. 1A) on the substrate 110, and a plurality of second mesa structures 120B that are spaced apart from one another with the grooves 122 therebetween and are connected to one another through the first mesa structure 120A at one end.

The light-emitting structure 120 includes, for example, a first conductive semiconductor layer 124, an active layer 126, and a second conductive semiconductor layer 128 that are sequentially formed on the substrate 110.

The first conductive semiconductor layer 124 includes, for example, first and second mesa areas 124A and 124B having a plurality of branching portions which are spaced apart from one another due to the plurality of grooves 122. For example, the first conductive semiconductor layer 124 includes the first mesa area 124A that constitutes a part of the first mesa structure 120A, and the plurality of second mess areas 124B that are spaced from one another with the grooves 122 therebetween and are connected to one another through the first mesa area 124A at one end.

A low surface portion 124E of the first conductive semiconductor layer 124 is exposed around the light-emitting structure 120 on an edge portion of the substrate 110. The low surface portion 124E of the first conductive semiconductor layer 124 has a surface that is, for example, on almost the same level as bottom surfaces 122B of the grooves 122, and is connected to the bottom surfaces 122B of the plurality of grooves 122. The low surface portion 124E of the first conductive semiconductor layer 124 may be used as a scribing line during a subsequent process of separating the substrate 110 in units of chips. Alternatively, for example, in an embodiment, the first conductive semiconductor layer 124 may not include the low surface portion 124E.

The first conductive semiconductor layer 124 may be formed of, for example, an n-type semiconductor, and the second conductive semiconductor layer 128 may be formed of a p-type semiconductor. In an embodiment, each of the first conductive semiconductor layer 124 and the second conductive semiconductor layer 128 may be formed of, for example, a nitride semiconductor having a composition represented by Al$_x$In$_y$Ga$_{1-x-y}$N (0≤x≤1, 0≤y≤1, and 0≤x+y≤1). Alternatively, each of the first conductive semiconductor layer 124 and the second conductive semiconductor layer 128 may be formed of, for example, an AlGaInP-based semiconductor, or an AlGaAs-based semiconductor. The first conductive semiconductor layer 124 may include, for example, silicon (Si), germanium (Ge), selenium (Se), or tellurium (Te) impurities. The second conductive semiconductor layer 128 may include, for example, magnesium (Mg), zinc (Zn), or beryllium (Be) impurities.

In an embodiment, the active layer 126 may have a structure, for example, in which a quantum well layer and a quantum barrier layer are alternately stacked at least one time. The quantum well layer may have a single quantum well structure or a multi-quantum well structure. In an embodiment, the active layer 126 may be formed of, for example, u-AlGaN. Alternatively, the active layer 126 may have a multi-quantum well structure formed of, for example, gallium nitride (GaN)/indium gallium nitride (InGaN), gallium nitride (GaN)/aluminum gallium nitride (AlGaN), indium gallium nitride (InAlGaN)/indium gallium nitride (InAlGaN), or indium gallium nitride (InGaN)/aluminum gallium nitride (AlGaN). To improve light-emitting efficiency of the active layer 126, a depth of a quantum well, the number of quantum well layers and quantum barrier layers, which are stacked as pairs, and a thickness of the active layer 126 may be changed.

A first electrode layer 130 is formed on the light-emitting structure 120. The first electrode layer 130 is connected to the second conductive semiconductor layer 128. The first electrode layer 130 is disposed on the light-emitting structure 120 to, for example, overlap with the first mesa area 124A constituting the first mesa structure 120A, and the plurality of mesa areas 124B constituting the second mesa structure 120B branching from the first mesa structure 120A. A portion of the first electrode layer 130 on the first mesa structure 120A constitutes a contact area 130C, and another portion of the first electrode layer 130 on the plurality of mesa structure 120B constitutes a non-contact area 130NC.

A portion of the first conductive semiconductor layer 124 is exposed on the bottom surfaces 122B of the plurality of grooves 122. A second electrode layer 140 is formed on the portion of the first conductive semiconductor layer 124, which is exposed on the bottom surfaces 122B of the plurality of grooves 122. The second electrode layer 140 extends, for example, in a longitudinal direction of the grooves 122 on the bottom surfaces 122B of the grooves 122. The second electrode layer 140 has a plurality of contact areas 140C that are disposed in the grooves 122. Although the plurality of contact areas 140C each have greater widths than other portions of the second electrode layer 140 in FIGS. 1A and 1B, the present embodiment is not limited thereto.

Each of the first electrode layer 130 and the second electrode layer 140 may have, for example, a single-layer structure formed of any one material selected from the group consisting of silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), and an alloy thereof, or a multi-layer structure formed of a combination thereof.

The first electrode layer 130 and the second electrode layer 140 are insulated from each other by, for example, a first insulating layer 150 that covers side walls of the first mesa structure 120A and the plurality of second mesa structures 120B branching from the first mesa structure 120A of the light-emitting structure 120. The non-contact area 130NC of the first electrode layer 130 is covered by a second insulating layer 160. The second insulating layer 160 covers, for example, the side walls of the first mesa structure 120A and the plurality of second mesa structures 120B branching from the first mesa structure 120A of the light-emitting structure 120 with the first insulating layer 150 therebetween.

A first bonding conductive layer 170 is formed on the first electrode layer 130. The first electrode layer 130 includes the contact area 130C that is connected to the first bonding conductive layer 170. The first bonding conductive layer 170 extends to, for example, overlap with the first mesa structure 120A over the first mesa structure 120A.

A second bonding conductive layer 180 is formed on the second electrode layer 140. The second electrode layer 140 is connected to the second bonding conductive layer 180 through the plurality of contact areas 140C. The second bonding conductive layer 180, for example, contacts the plurality of contact areas 140C and the second insulating layer 160 over the plurality of second mesa structures 120B, and extends to overlap with the plurality of second mesa structures 120B. The second bonding conductive layer 180 covers a part of the non-contact area 130NC of the first electrode layer 130 with the second insulating layer 160 therebetween. Due to the second insulating layer 160, the non-contact area 130NC of the first electrode layer 130 and the second bonding conductive layer 180 may be insulated from each other.

The first bonding conductive layer 170 and the second bonding conductive layer 180 are, for example, spaced apart from each other by a predetermined distance. The first bonding conductive layer 170 and the second bonding conductive layer 180 respectively have, for example, substantially flat surfaces 170P and 180P that are opposite to surfaces facing the first electrode layer 130 and the second electrode layer 140.

The first bonding conductive layer 170 includes, for example, a first main bonding layer 172, and a first filling bonding layer 174 that is formed on the first main bonding layer 172. The first main bonding layer 172 has, for example, a first recess area 172R that is formed by a stepped portion in a surface opposite to a contact surface 172C contacting the first electrode layer 130. The first filling bonding layer 174 is formed in the first recess area 172R. The first main bonding layer 172 and the first filling bonding layer 174 have, for example, flat surfaces that extend on the same plane and are opposite to surfaces facing the first electrode layer 130. Accordingly, a part of the first main bonding layer 172 and a part of the first filling bonding layer 174 may constitute the flat surface 170P.

The second bonding conductive layer 180 includes, for example, a second main bonding layer 182, and a plurality of second filling bonding layers 184 that are formed on the second main bonding layer 182. The second main bonding layer 182 includes, for example, a plurality of second recess areas 182R that are formed in a surface opposite to a surface facing the second electrode layer 140. The plurality of second filling bonding layers 184 respectively fill the plurality of second recess areas 182R. The plurality of second recess areas 182R, which are formed by stepped portions of the plurality of second mesa structures 120B, are formed in surfaces opposite to a plurality of contact surfaces 182C of the second main bonding layer 182 that contact the plurality of contact areas 140C, to be aligned with the plurality of contact areas 140C of the second electrode layer 140. The plurality of second filling bonding layers 184 are disposed, for example, to vertically overlap with the plurality of contact areas 140C of the second electrode layer 140. The second main bonding layer 182 and the second filling bonding layers 184 have, for example, flat surfaces that extend on the same plane and are opposite to surfaces facing the first electrode layer 130 and the second electrode layer 140. Accordingly, a part of the second main bonding layer 182 and parts of the second filling bonding layers 184 may constitute the flat surface 180P.

Each of the first main bonding layer 172 and the second main bonding layer 182 may have, for example, a single-layer structure formed of a single material selected from the group consisting of gold (Au), tin (Sn), nickel (Ni), lead (Pb), silver (Ag), indium (In), chromium (Cr), germanium (Ge), silicon (Si), titanium (Ti), tungsten (W), platinum (Pt), and an alloy including at least two materials thereof, or a multi-layer structure formed of a combination thereof. In an embodiment, each of the first main bonding layer 172 and the second main bonding layer 182 may include, for example, a gold (Au)-tin (Sn) alloy, a nickel (Ni)-tin (Sn) alloy, a nickel (Ni)-gold (Au)-tin (Sn) alloy, a lead (Pb)-silver (Ag)-indium (In) alloy, a lead (Pb)-silver (Ag)-tin (Sn) alloy, a lead (Pb)-tin (Sn) alloy, a gold (Au)-germanium (Ge) alloy, or a gold (Au)-silicon (Si) alloy.

Each of the first filling bonding layer 174 and the second filling bonding layers 184 may have, for example, a single-layer structure formed of a single material selected from the group consisting of Au, Sn, Ni, Pb, Ag, In, Cr, Ge, Si, Ti, W, Pt, a conductive polymer, and an alloy including at least two materials thereof, or a multi-layer structure formed of a combination thereof. In an embodiment, each of the first filling bonding layer 174 and the second filling bonding layers 184 may include, for example, an Au—Sn alloy, an Ni—Sn alloy, an Ni—Au—Sn alloy, a Pb—Ag—In alloy, a Pb—Ag—Sn alloy, a Pb—Sn alloy, an Au—Ge alloy, or an Au—Si alloy. Alternatively, each of the first filling bonding layer 174 and the second filling bonding layers 184 may be formed of, for example, only a conductive polymer.

Materials of the first main bonding layer 172 and the second main bonding layer 182 may be, for example, different from materials of the first filling bonding layer 174 and the second filling bonding layers 184. In an embodiment, each of the first main bonding layer 172 and the second main bonding layer 182 may have, for example, a single-layer structure formed of a single material selected from the group consisting of Au, Sn, Ni, Pb, Ag, In, Cr, Ge, Si, Ti, W, Pt, and an alloy including at least two materials thereof, or a multi-layer structure formed of a combination thereof. Each of the first filling bonding layer 174 and the second filling bonding layers 184 may be formed of, for example, a conductive polymer. The conductive polymer may be selected from the group consisting of, but is not limited to, polyacetylene, polyaniline, polypyrrole, polythiophene, poly sulfur nitride, poly(2- or 3-alkylthiophene), polyphenylene, polyphenylene sulfide, polyisothiannaphthene, polyazulene, polyfuran, poly(phenylenevinylene), poly(thienylene-vinylene) and combinations thereof.

In an embodiment, each of the first main bonding layer 172 and the second main bonding layer 182, and the first filling bonding layer 174 and the second filling bonding layers 184 may have, for example, a multi-layer structure in which different metals are sequentially stacked, or may be formed of an alloy. In an embodiment, each of the first main bonding layer 172 and the second main bonding layer 182 may have, for example, a multi-layer structure in which Ni and Sn are sequentially stacked, or may be formed of an alloy including Ni and Sn. Each of the first filling bonding layer 174 and the second filling bonding layers 184 may have, for example, a multi-layer structure in which Au and Sn are sequentially stacked, or may be formed of an alloy including Au and Sn.

In an embodiment, the first filling bonding layer 174 and the second filling bonding layers 184, and the first main bonding layer 172 and the second main bonding layer 182 may include, for example, the same material. In this case, a process of forming the first filling bonding layer 174 and the second filling bonding layers 184 and a process of forming the first main bonding layer 172 and the second main bonding layer 182 may be, for example, separately performed, and as a result, there may exist interfaces between the first filling bonding layer 174 and the first main bonding layer 172, and between the second filling bonding layers 184 and the second main bonding layer 182.

Although the substrate 110 has a flat top surface 110A in FIGS. 1A and 1B, the present embodiment is not limited thereto. For example, the substrate 110 may include, for example, an uneven pattern formed on at least a part of a surface of the substrate 110.

Figure 2:
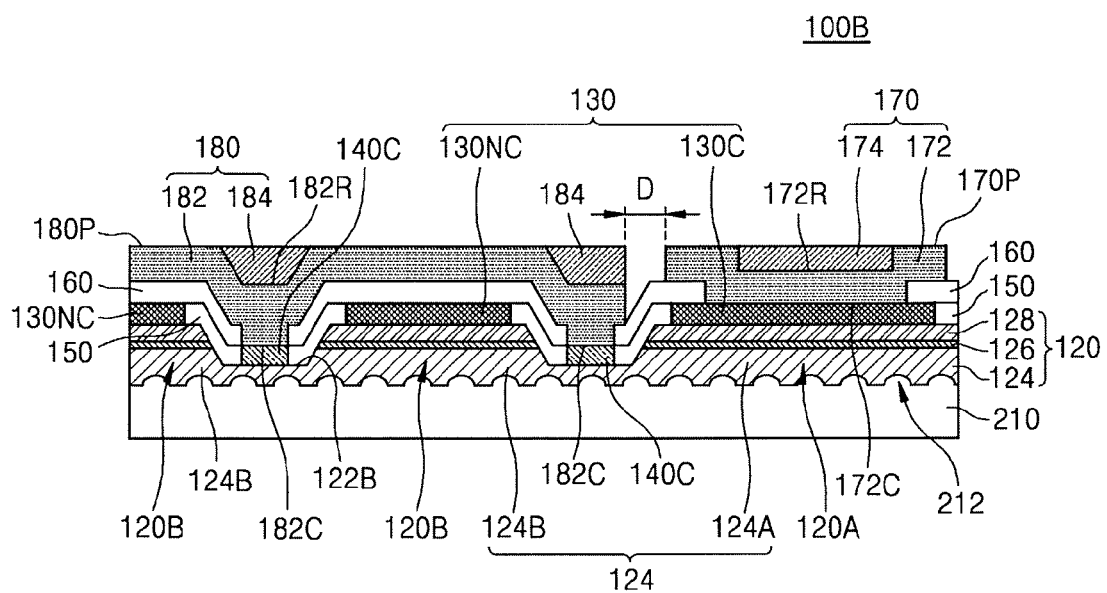
FIG. 2 is a cross-sectional view illustrating a semiconductor light-emitting device according to an embodiment of the inventive concept.

FIG. 2 is a cross-sectional view illustrating a semiconductor light-emitting device 100E according to an embodiment of the inventive concept. In FIG. 2, the same elements as those in FIGS. 1A and 1B are denoted by the same reference numerals and a detailed explanation thereof will not be given for briefness.

The semiconductor light-emitting device 100B is substantially the same as the semiconductor light-emitting device 100A of FIGS. 1A and 1B except that a substrate has a surface that faces the first conductive semiconductor layer 124 and on which an uneven pattern 212 is formed. A detailed explanation of the substrate 210 is the same as that made for the substrate 110 with reference to FIGS. 1A and 1B.

As the uneven pattern 212 is formed on the surface of the substrate 210, the crystallinity of semiconductor layers formed on the substrate 210 is increased and a defect density is reduced, thereby increasing internal quantum efficiency. Extraction efficiency due to diffused reflection of light on the surface of the substrate 210 is increased, thereby increasing light extraction efficiency of the semiconductor light-emitting device 100B.

FIGS. 3A through 3I are cross-sectional views for explaining a method of manufacturing a semiconductor light-emitting device, according to an embodiment of the inventive concept. A process of manufacturing the semiconductor light-emitting device 100B of FIG. 2 will be exemplarily explained. In FIGS. 3A through 3I, the same elements as those in FIGS. 1A, 1B, and 2 are denoted by the same reference numerals, and a detailed explanation thereof will not be given for briefness.

Figure 3A:
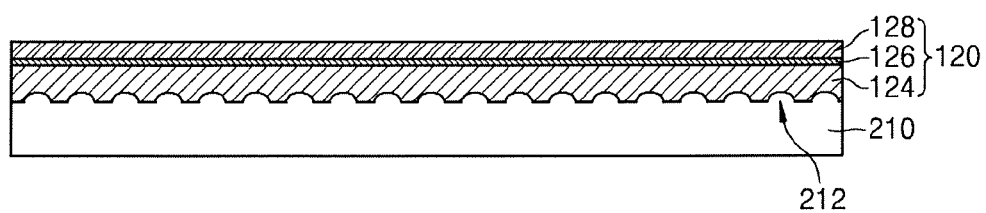
FIGS. 3A through 3I are cross-sectional views for explaining a method of manufacturing a semiconductor light-emitting device, according to an embodiment of the inventive concept.

Referring to FIG. 3A, after the substrate 210 on which the uneven pattern 212 is formed is prepared, the light-emitting structure 120 including the first conductive semiconductor layer 124, the active layer 126, and the second conductive semiconductor layer 128, which are sequentially stacked, is formed on the substrate 210.

In an embodiment, the substrate 210 may be formed of, for example, sapphire. For example, in this case, to prepare the substrate 210 on which the uneven pattern 212 is formed, a patterned sapphire substrate surface finishing technology may be used. For example, a C(0001) surface of a sapphire substrate may be washed and finished, the sapphire substrate may be etched by using a nickel (Ni) etch mask, and then the Ni etch mask may be removed.

Alternatively, for example, in an embodiment, the substrate 110 of the semiconductor light-emitting device 110A of FIGS. 1A and 1B having the flat top surface may be used instead of the substrate 210 of the semiconductor light-emitting device 110B of FIG. 2.

The first conductive semiconductor layer 124, the active layer 126, and the second conductive semiconductor layer 128 may be formed by using, for example, metal organic chemical vapor deposition (MOCVD), hydride vapor phase epitaxy (HVPE), or molecular beam epitaxy (MBE).

Figure 3B:
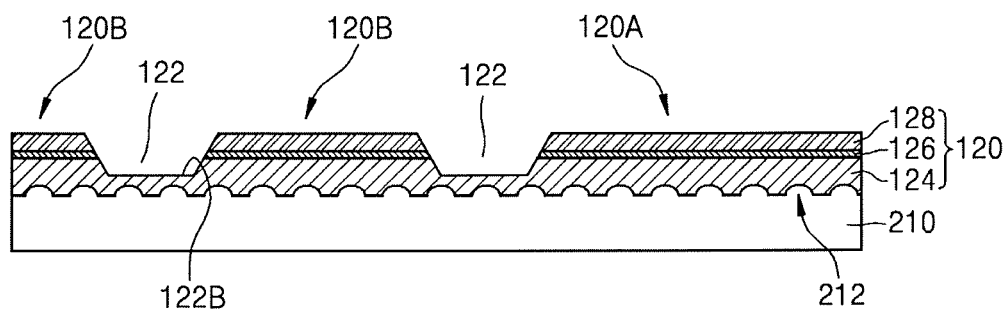

Referring to FIG. 3B, the grooves 122 are formed by, for example, etching a portion corresponding to an area where the second electrode layer 140 is to be formed from the second conductive semiconductor layer 128 to a predetermined depth of the first conductive semiconductor layer 124. The first conductive semiconductor layer 124 is partially exposed on the bottom surfaces 122B of the grooves 122. Although side walls of the grooves 122 are inclined in FIG. 3B, the present embodiment is not limited thereto. For example, alternatively, in an embodiment, the grooves 122 may have side walls perpendicular to a direction in which the substrate 210 extends.

Like the low surface portion 124E of the first conductive semiconductor layer 124 of FIG. 1A, a low surface portion (not shown) may be formed along an edge of the substrate 210. The low surface portion through which the first conductive semiconductor layer 124 is exposed on an edge portion of the substrate 210 may be formed by, for example, etching a stacked structure of the first conductive semiconductor layer 124, the active layer 126, and the second conductive semiconductor layer 128 from the top to a predetermined depth of the first conductive semiconductor layer 124. In an embodiment, an etching process for forming the low surface portion may be performed, for example, at the same time that a process of forming the grooves 122 is performed. Alternatively, in an embodiment, an etching process for forming the low surface portion of the first conductive semiconductor layer 124 may be performed, for example, as a separate process before or after the grooves 122 are formed. Moreover, alternatively in an embodiment, an etching process for forming the low surface portion of the first conductive semiconductor layer 124 may, for example, be omitted.

After the grooves 122 are formed, the first mesa structure 120A and the plurality of second mesa structures 120B that are connected to one another through the first mesa structure 120A are formed on the substrate 210.

The grooves 122, and the low surface portion of the first conductive semiconductor layer 124 may be formed by using, for example, reactive ion etching (RIE).

Figure 3C:
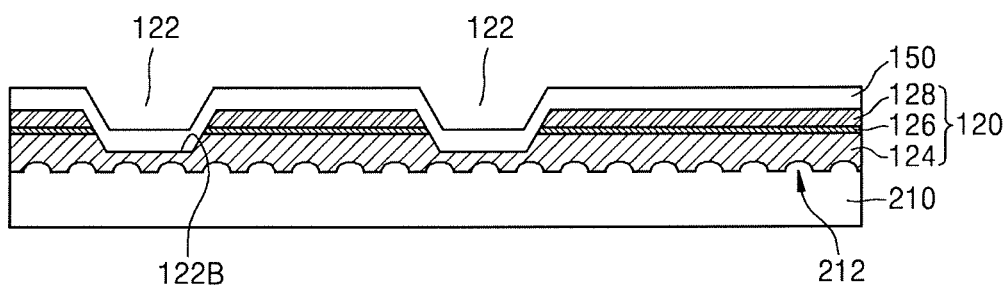

Referring to FIG. 3C, the first insulating layer 150 is formed on the light-emitting structure 120 of FIG. 3B.

The first insulating layer 150 is formed to cover the bottom surfaces 122B of the grooves 122 and an exposed surface of the light-emitting structure 120.

The first insulating layer 150 may be formed of, but is not limited to, a silicon oxide film, a silicon nitride film, an insulating polymer, or a combination thereof. In an embodiment, the first insulating layer 150 may be formed by using, for example, plasma enhanced chemical vapor deposition (PECVD).

Figure 3D:
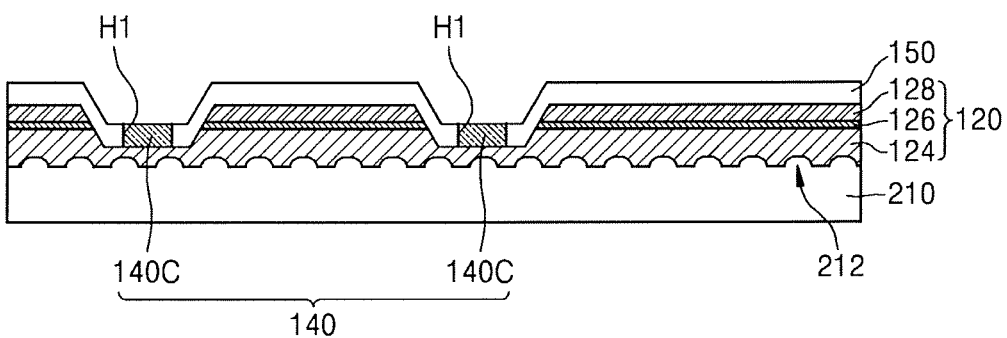

Referring to FIG. 3D, after holes H1 through which the bottom surfaces 122B of the grooves 122 are exposed are formed by etching a part of the first insulating layer 150, the second electrode layer 140 that is connected to the first conductive semiconductor layer 124 through the holes H1 is formed. The second electrode layer 140 may include, for example, the plurality of contact areas 140C.

In an embodiment, the holes H1 may be formed in the first insulating layer 150 by using, for example, RIE or wet etching using a buffered oxide etchant (BOE). The second electrode layer 140 may have, for example, a single-layer structure formed of any one selected from the group consisting of Ag, Al, Ni, Cr, Pd, Cu, Pt, Sn, W, Au, rhodium (Rh), iridium (Ir), ruthenium (Ru), magnesium (Mg), zinc (Zn), titanium (Ti) and an alloy thereof, or a multi-layer structure formed of a combination thereof. For example, the second electrode layer 140 may be formed to have, but is not limited to, an Al/Ti/Pt stacked structure.

Figure 3E:
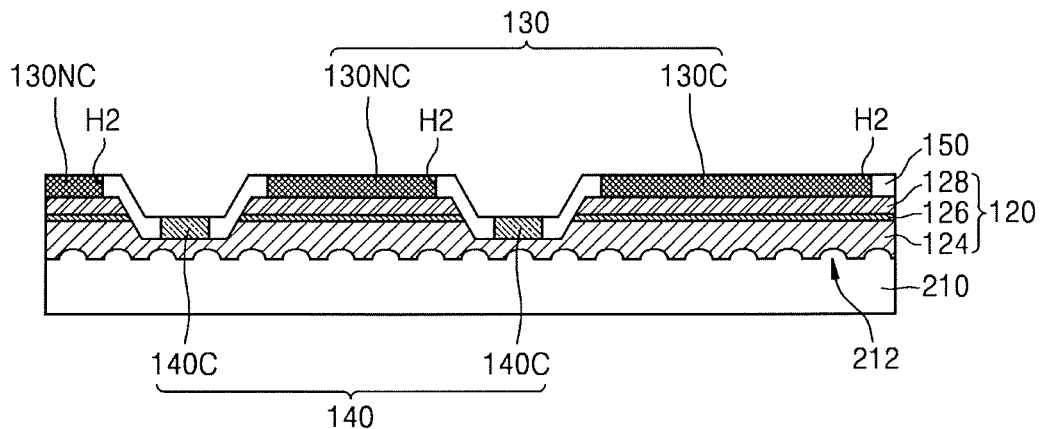

Referring to FIG. 3E, after holes H2 through which the second conductive semiconductor layer 128 is exposed are formed by etching a part of the first insulating layer 150, the first electrode layer 130 that is connected to the second conductive semiconductor layer 128 through the second holes H2 is formed.

The holes H2 may be formed in the first insulating layer 150 by using, for example, RIE or wet etching using a BOE. The first electrode layer 130 may have, for example, a single-layer structure formed of any one selected from the group consisting of Ag, Al, Ni, Cr, Pd, Cu, Pt, Sn, W, Au, Rh, uranium (Ur), Ru, Mg, Zn, Ti and an alloy thereof, or a multi-layer structure formed of a combination thereof. In an embodiment, the first electrode layer 130 may include, for example, a metal layer that has both ohmic characteristics and light-reflecting characteristics. Alternatively, in an embodiment, the first electrode layer 130 may have, for example, a multi-layer structure in which a first metal layer having ohmic characteristics and a second metal layer having light-reflecting characteristics are sequentially stacked. For example, the first electrode layer 130 may have, but is not limited to, a Ni/Ag/Pt/Ti/Pt stacked structure.

Although a process of forming the second electrode layer 140 described with reference to FIG. 3C is performed, followed by a process of forming the second electrode layer 130 described with reference to FIG. 3D, the present embodiment is not limited thereto. For example, a process of forming the first electrode layer 130 described with reference to FIG. 3D may be performed, and then a process of forming the second electrode layer 140 described with reference to FIG. 3C may be performed.

Figure 3F:
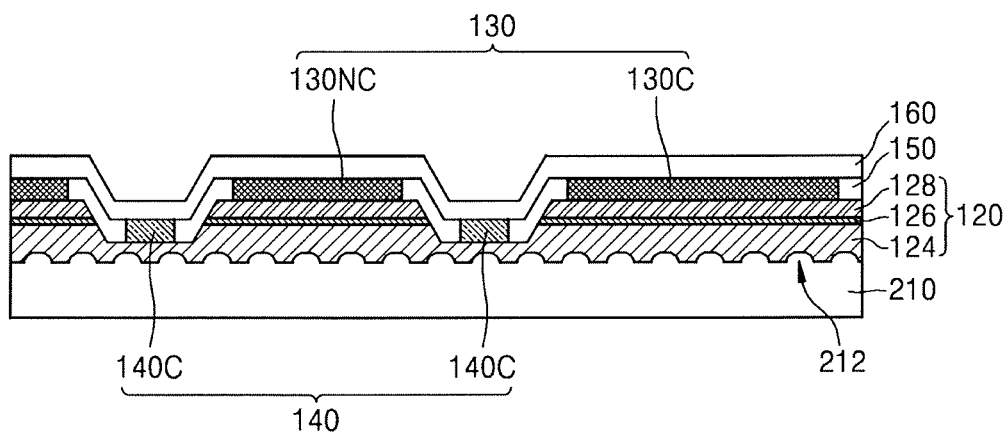

Referring to FIG. 3F, the second insulating layer 160 is formed on the first electrode layer 130, the second electrode layer 140, and the first insulating layer 150.

The second insulating layer 160 may be formed of, but is not limited to, a silicon oxide film, a silicon nitride film, an insulating polymer, or a combination thereof. In an embodiment, the second insulating layer 160 and the first insulating layer 150 may be formed of, for example, the same material. Alternatively, in an embodiment, the second insulating layer 160 may be formed of, for example, a material different from that of the first insulating layer 150. The second insulating layer 160 may be formed by using, for example, PECVD.

Figure 3G:
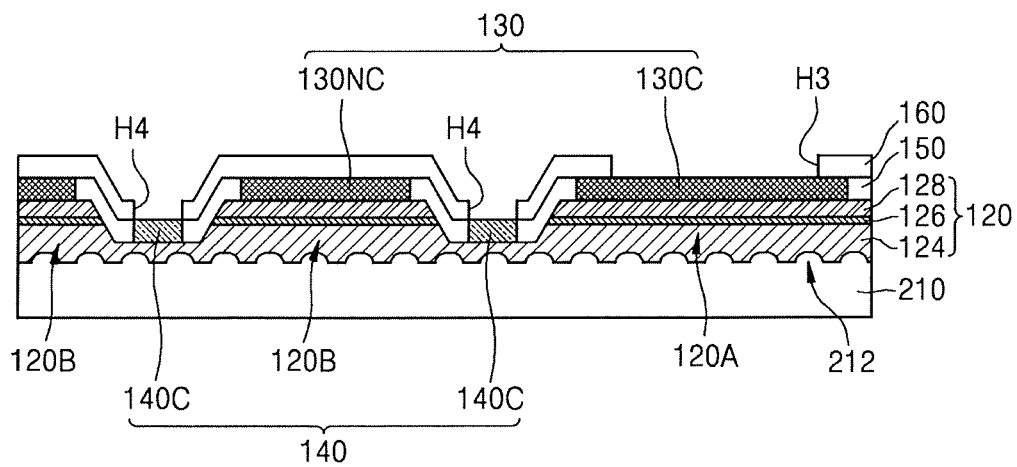

Referring to FIG. 3G, a hole H3 through which the first electrode layer 130 is exposed on the first mesa structure 120A and a plurality of holes H4 through which the contact areas 140C of the second electrode layer 140 formed in the bottom surfaces 122B of the grooves 122 are exposed are formed by, for example, etching a part of the second insulating layer 160.

The hole H3 and the plurality of holes H4 may be formed in the second insulating layer 160 by using, for example, RIE or wet etching using a BOE.

Figure 3H:
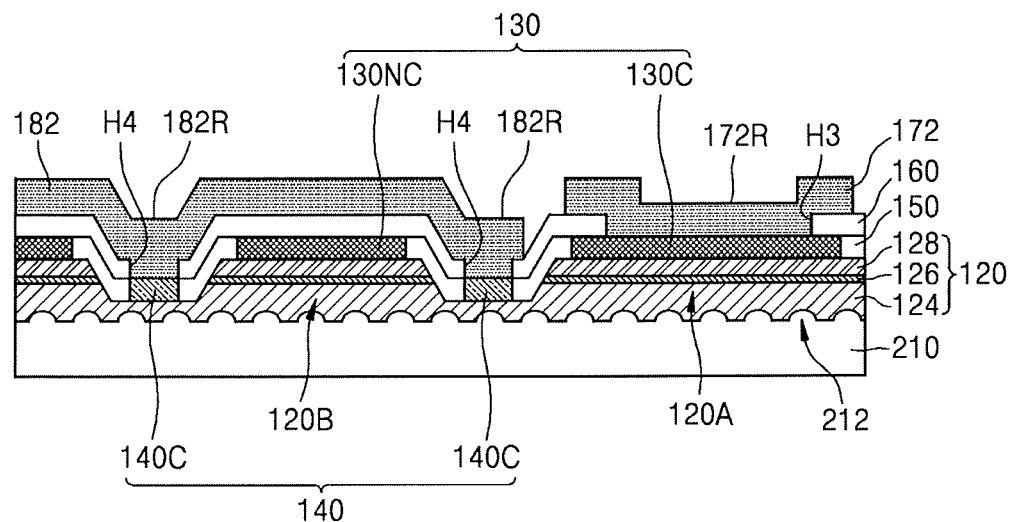

Referring to FIG. 3H, the first main bonding layer 172 that is connected to the contact area 130C of the first electrode layer 130 through the hole H3 formed in the second insulating layer 160 and the second main bonding layer 182 that is connected to the contact areas 140C of the second electrode layer 140 through the plurality of holes H4 are formed by, for example, depositing a conductive material on a resultant structure of FIG. 3G.

Each of the first main bonding layer 172 and the second main bonding layer 182 may include, for example, a eutectic bonding metal. After the first main bonding layer 172 and the second main bonding layer 182 are formed, stepped portions corresponding to top surface profiles of the plurality of second mesa structures 120B and the first mesa structure 120A are formed on top surfaces of the first main bonding layer 172 and the second main bonding layer 182, the first recess area 172R is formed in the top surface of the first main bonding layer 172, and the plurality of second recess areas 182R are formed in the top surface of the second main bonding layer 182.

Figure 3I:
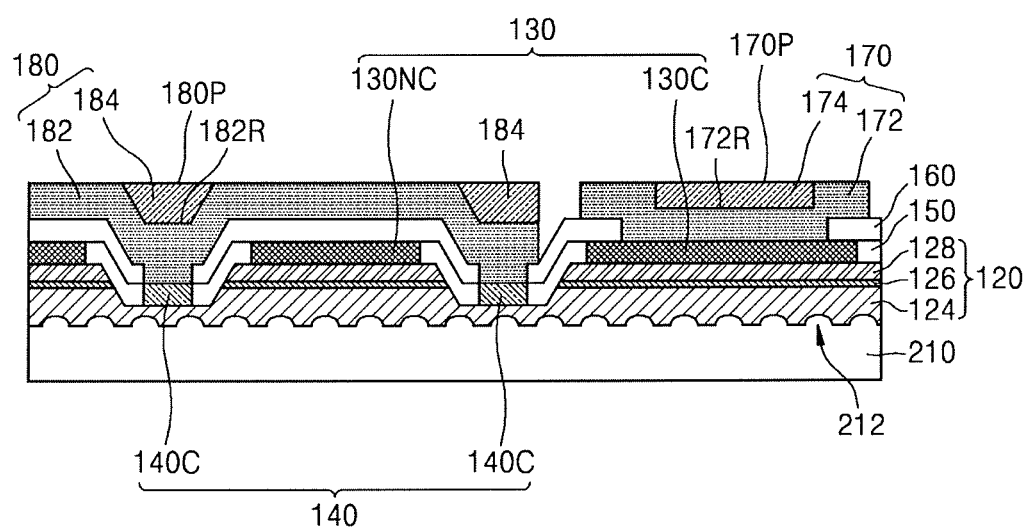

Referring to FIG. 3I, the first filling bonding layer 174 and the plurality of second filling bonding layers 184 are formed by, for example, filling conductive materials in the first recess area 172R formed in the first main bonding layer 172 and in the plurality of recess areas 182R formed in the second main bonding layer 182.

Each of the first filling bonding layer 174 and the plurality of second filling bonding layers 184 may be formed of, for example, a eutectic metal or a conductive polymer. The first filling bonding layer 174 and the plurality of second filling bonding layers 184 may be formed by using, for example, inkjet printing, chemical vapor deposition (CVD), or physical vapor deposition (PVD).

When the first filling bonding layer 174 and the plurality of second filling bonding layers 184 are formed by using CVD or PVD, the first filling bonding layer 174 and the plurality of filling bonding layers 184 may be formed by using, for example, a mask pattern (not shown) that covers an area other than an area where the first filling bonding layer 174 and the plurality of second filling bonding layers 184 are to be formed, and then the mask pattern may be removed.

When the first filling bonding layer 174 and the plurality of second filling bonding layers 184 are formed by using inkjet printing, a separate mask pattern for covering an unnecessary portion is not required. When the first filling bonding layer 174 and the plurality of second filling bonding layers 184 are formed by using inkjet printing, a process of spraying ink including a molten metal droplet or metal powder having a minimum size of several microns such as, for example, about 5 microns, to the first recess area 174R and the second recess areas 182R may be performed. For example, inkjet printing may be drop-on-demand (DOD) inkjet printing. In DPD inkjet printing, ink may be sprayed according to an electrical signal only when needed. To perform DOD inkjet printing, a piezoelectric method that forms ink droplets by instantaneously changing a pressure in an ink-filled chamber, or a heat transfer method that sprays ink by generating vapor through instantaneous heating may be used.

In an embodiment, the first main bonding layer 172 and the second main bonding layer 182 having relatively large volumes in the first bonding conductive layer 170 and the second bonding conductive layers 180 may be formed of relatively inexpensive materials, and the first filling bonding layer 174 and the plurality of second filling bonding layers 184 having relatively small volumes may be formed of relatively expensive materials having high bonding strength, thereby reducing manufacturing costs and increased product reliability.

The first bonding conductive layer 170 and the second bonding conductive layer 180 obtained after the first filling bonding layer 174 and the plurality of second filling bonding layers 184 are formed may respectively have, for example, the flat surfaces 170P and 180P.

Figure 4:
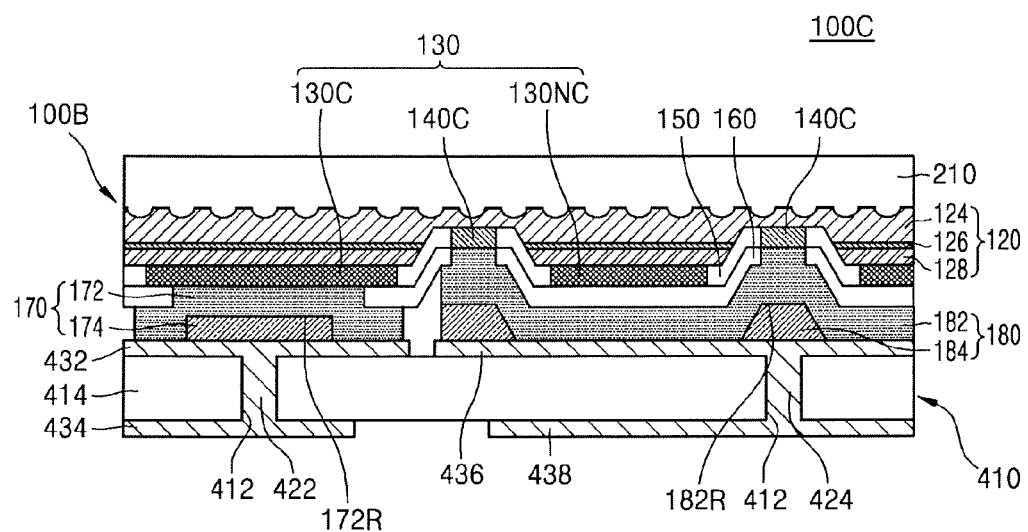
FIG. 4 is a cross-sectional view illustrating major elements of a semiconductor light-emitting device according to an embodiment of the inventive concept.

FIG. 4 is a cross-sectional view illustrating major elements of a semiconductor light-emitting device 100C according to an embodiment of the inventive concept. The semiconductor light-emitting device 100C has a structure in which the semiconductor light-emitting device 100B of FIG. 2 is mounted on a package substrate 410. The same elements as those in FIGS. 1A, 1B, and 2 are denoted by the same reference numerals, and a detailed explanation thereof will not be given.

Referring to FIG. 4, the package substrate 410 includes, for example, a substrate body 414 in which a plurality of through-holes 412 are formed, a plurality of through-electrodes 422 and 424 formed in the plurality of through-holes 412, and a plurality of conductive layers formed on an upper surface and a lower surface of the substrate body 414. The plurality of conductive layers include, for example, a first conductive layer 432 and a second conductive layer 434 that are formed on an upper surface and a lower surface of the substrate body 414 and are respectively connected to both ends of the through-electrode 422, and a third conductive layer 436 and a fourth conductive layer 438 that are formed on an upper surface and a lower surface of the substrate body 414 and are respectively connected to both ends of the through-electrode 424. For example, the first conductive layer 432 and the third conductive layer 436 formed on one surface of the substrate body 414 are spaced apart from each other, and the second conductive layer 434 and the fourth conductive layer 438 on the other surface of the substrate body 414 are spaced apart from each other.

The substrate body 414 may be a circuit substrate such as, for example, a printed circuit board (PCB), a metal core PCB (MCPCB), or a flexible PCB (FPCB), or a ceramic substrate formed of aluminum nitride (AlN) or aluminum oxide ($Al_2O_3$). Alternatively, in an embodiment, a structure including, for example, a lead frame instead of the package substrate 410 may be used in FIG. 4.

Each of the through electrodes 422 and the first through fourth conductive layers 432, 434, 436, and 438 may be formed of, for example, Cu, Au, Ag, Ni, W, Cr, or a combination thereof.

The first bonding conductive layer 170 is connected to the first conductive layer 432, and the second bonding conductive layer 180 is connected to the third conductive layer 436. For example, to respectively bond the first bonding conductive layer 170 and the second bonding conductive layer 180 to the first conductive layer 432 and the third conductive layer 436 by using eutectic die bonding, the semiconductor light-emitting device 100B of FIG. 2 is disposed on the package substrate 410 such that the first bonding conductive layer 170 and the second bonding conductive layer 180 respectively face the first conductive layer 432 and the third conductive layer 436, and then thermo-compression may be performed at a temperature of about 200 to about 700° C.

As the first bonding conductive layer 170 is bonded to the first conductive layer 432 and the second bonding conductive layer 180 is bonded to the third conductive layer 436 by using eutectic die bonding, an adhesion having high reliability and high strength may be maintained.

As described above, stepped portions are formed on top surfaces of the first main bonding layer 172 and the second main bonding layer 182 due to stepped portions of structures disposed under the first main bonding layer 172 and the second main bonding layer 182. For example, many relatively large stepped portions exist on the top surface of the second main bonding layer 182 due to stepped portions formed by the plurality of second mesa structures 120B disposed under the second main bonding layer 182, and accordingly, the plurality of second recess areas 182R having relatively great depths are formed. The first recess area 172R formed in the first main bonding layer 172 of the first bonding conductive layer 170 is filled with the first filling bonding layer 174, and the second recess areas 182R formed in the second main bonding layer 182 of the second bonding conductive layer 180 are filled with the second filling bonding layers 184. Accordingly, empty spaces between the package substrate 410 and the first bonding conductive layer 170 and between the package substrate 410 and the second bonding conductive layer 180 are minimized, and interfaces between the package substrate 410 and the first bonding conductive layer 170 and the second bonding conductive layer 180 are planarized, thereby increasing adhesive characteristics. Accordingly, the risk of deterioration and contamination that may occur when empty spaces exist between the package substrate 410 and the first bonding conductive layer 170 and the second bonding conductive layer 180 such as, for example, deterioration or contamination due to moisture present in the empty spaces, is eliminated, thereby increasing reliability.

Also, when each of the first filling bonding layer 174 and the second filling bonding layers 184 is formed of a metal, a volume of a metal in a bonding area is increased due to the first filling bonding layer 174 and the second filling bonding layers 184, and thus heat resistance is reduced, thereby increasing reliability.

Figure 5:
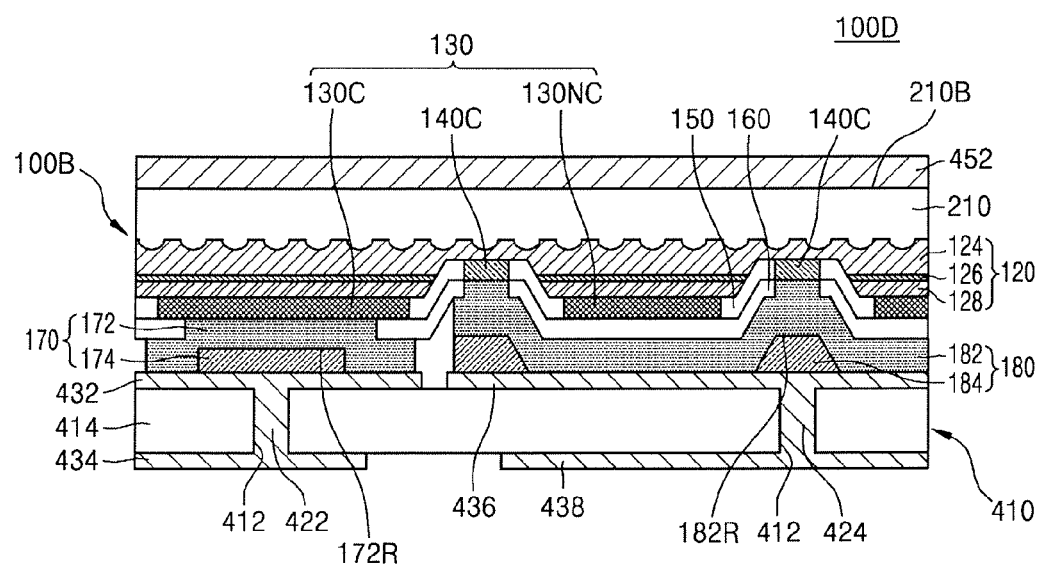
FIG. 5 is a cross-sectional view illustrating major elements of a semiconductor light-emitting device according to an embodiment of the inventive concept.

FIG. 5 is a cross-sectional view illustrating major elements of a semiconductor light-emitting device 100D according to another embodiment of the inventive concept. In FIG. 5, the same elements as those in FIGS. 1A through 4 are denoted by the same reference numerals, and a detailed explanation thereof will not be given.

The semiconductor light-emitting device 100D is substantially the same as the semiconductor light-emitting device 100C of FIG. 4 except that a backside surface 210B of the substrate 210 is covered by a wavelength conversion unit 452.

The wavelength conversion unit 452 may function to convert a wavelength of light emitted from the semiconductor light-emitting device 100B into another wavelength. In an embodiment, the wavelength conversion unit 452 may include, for example, a resin layer including phosphors or quantum dots.

Figure 6:
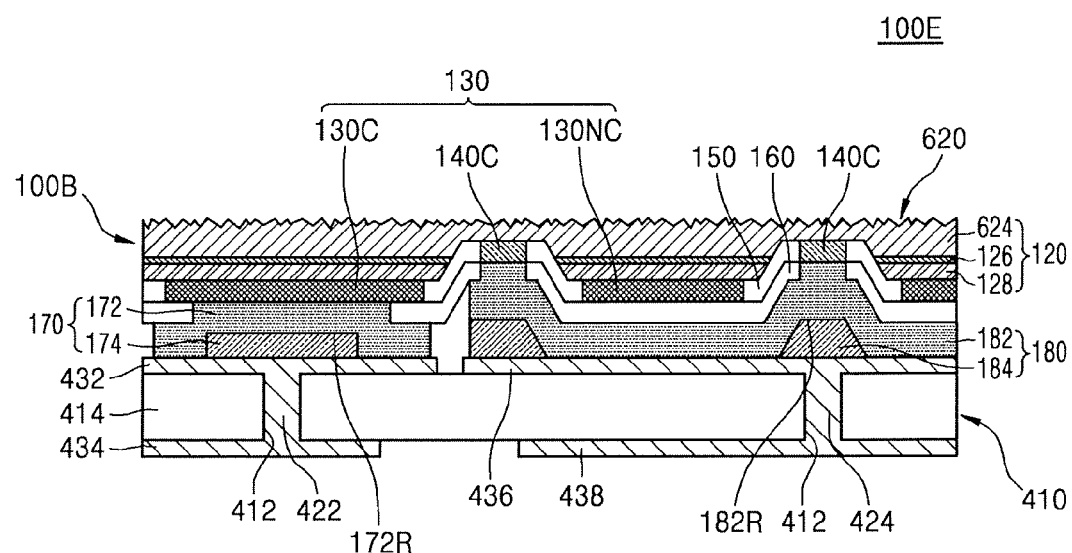
FIG. 6 is a cross-sectional view illustrating major elements of a semiconductor light-emitting device according to an embodiment of the inventive concept.

FIG. 6 is a cross-sectional view illustrating major elements of a semiconductor light-emitting device 100E according to an embodiment of the inventive concept. In FIG. 6, the same elements as those in FIGS. 1A through 4 are denoted by the same reference numerals, and a detailed explanation thereof will not be given.

The semiconductor light-emitting device 100E includes, for example, a first conductive semiconductor layer 624 having an uneven surface 620. For example, in an exemplary process for manufacturing the semiconductor light-emitting device 100E, the first conductive semiconductor layer 624 may be formed by bonding the semiconductor light-emitting device 100A of FIG. 1B to the package substrate 410 of FIG. 4 by using the first bonding conductive layer 170 and the second bonding conductive layer 180, removing the substrate 110, and periodically forming an uneven pattern having a regular shape or an irregular shape on an exposed surface of the first conductive semiconductor layer 124.

As the semiconductor light-emitting device 100E includes the first conductive semiconductor layer 624 having the uneven surface 620, light loss may be suppressed and brightness may be increased.

Figure 7:
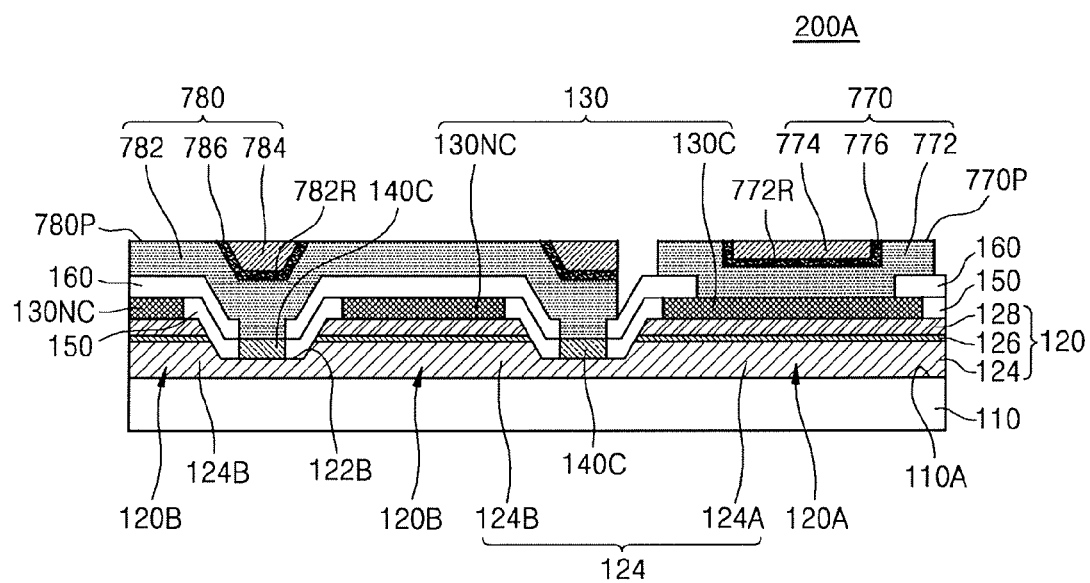
FIG. 7 is a cross-sectional view illustrating major elements of a semiconductor light-emitting device according to an embodiment of the inventive concept.

FIG. 7 is a cross-sectional view illustrating a semiconductor light-emitting device 200A according to an embodiment of the inventive concept. In FIG. 7, the same elements as those in FIGS. 1A and 1B are denoted by the same reference numerals, and a detailed explanation thereof will not be given.

The semiconductor light-emitting device 200A includes, for example, a first bonding conductive layer 770 that is connected to the contact area 130C of the first electrode layer 130, and a second bonding conductive layer 780 that is connected to the plurality of contact areas 140C of the second electrode layer 140. The second bonding conductive layer 780 covers the non-contact area 130NC of the first electrode layer 130 with the second insulating layer 160 therebetween.

The first bonding conductive layer 770 and the second bonding conductive layer 780 have, for example, substantially flat surfaces 770P and 780P that are opposite to surfaces facing the first electrode layer 130 and the second electrode layer 140.

The first bonding conductive layer 770 includes, for example, a first main bonding layer 772, a first filling bonding layer 774, and a first barrier layer 776 disposed between the first main bonding layer 772 and the first filling bonding layer 774. A part of the first main bonding layer 772, a part of the first filling bonding layer 774, and a part of the first barrier layer 776 may be exposed on the flat surface 770P.

The second bonding conductive layer 780 includes, for example, a second main bonding layer 782, a plurality of second filling bonding layers 784, and a plurality of second barrier layers 786 disposed between the second main bonding layer 782 and the plurality of second filling bonding layers 784. A part of the second main bonding layer 782, parts of the plurality of second filling bonding layers 784, and parts of the plurality of second barrier layers 786 are exposed on the flat surface 780P.

Each of the first barrier layer 776 and the plurality of second barrier layers 786 may be formed of, for example, titanium (Ti), tantalum (Ta), titanium nitride (TiN), tantalum nitride (TaN), platinum (Pt), or a combination thereof.

As the first bonding conductive layer 770 and the second bonding conductive layer 780 respectively include the first barrier layer 776 and the plurality of second barrier layers 786, when the semiconductor light-emitting device 200A is bonded to a package substrate by using eutectic die bonding by using the first bonding conductive layer 770 and the second bonding conductive layer 780, the risk of metal diffusion that may occur between the first main bonding layer 772 and the first filling bonding layer 774, and between the second main bonding layer 782 and the plurality of second filling bonding layers 784 due to a relatively high process temperature between the first main bonding layer 772 and the first filling bonding layer 774, and between the second main bonding layer 782 and the plurality of second filling bonding layers 784 may be eliminated due to the first barrier layer 776 and the plurality of second barrier layers 786. Accordingly, after a eutectic bonding process, a change in a content ratio in each of the first bonding conductive layer 770 and the second bonding conductive layer 780 may be suppressed. A function of preventing metal diffusion by using the first barrier layer 776 and the plurality of second barrier layers 786 may be even more effective when the first main bonding layer 772 and the first filling bonding layer 774 include different metals and the second main bonding layer 782 and the plurality of second filling bonding layers 784 include different metals.

Accordingly, a beneficial bonding process may be performed, for example, in a state where an initial content ratio of each of the first main bonding layer 772 and the first filling bonding layer 774 formed to have an appropriate content ratio in a eutectic die bonding is maintained.

For example, in an exemplary process for forming the first bonding conductive layer 770 and the second bonding conductive layer 780, after the first main bonding layer 772 and the second main bonding layer 782 are formed in a manner similar to that used to form the first main bonding layer 172 and the second main bonding layer 182 described with reference to FIG. 3H, the first barrier layer 776 and the plurality of second barrier layers 786 that fill parts of the recess areas 772R and 782R of the first main bonding layer 772 and the second main bonding layer 782 are simultaneously formed. In an embodiment, the first barrier layer 776 and the plurality of second barrier layers 786 may be formed by using, for example, inkjet printing, CVD, or PVD. Next, in a manner similar to that used to form the first filling bonding layer 174 and the plurality of second filling bonding layers 184 described with reference to FIG. 3I, the first filling bonding layer 774 and the plurality of second filling bonding layers 784 that fill remaining parts of the recess areas 772R and 782R are, for example, simultaneously formed.

Figure 8:
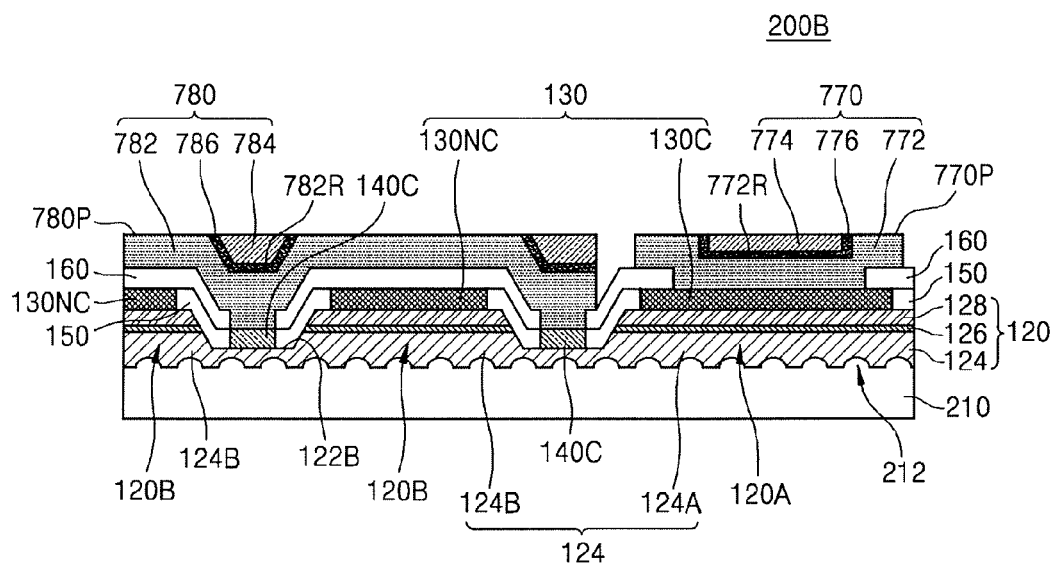
FIG. 8 is a cross-sectional view illustrating major elements of a semiconductor light-emitting device according to an embodiment of the inventive concept.

FIG. 8 is a cross-sectional view illustrating a semiconductor light-emitting device 200B according to an embodiment of the inventive concept. In FIG. 8, the same elements as those in FIGS. 1A through 7 are denoted by the same reference numerals, and a detailed explanation thereof will not be given.

The semiconductor light-emitting device 200B is substantially the same as the semiconductor light-emitting device 200A of FIG. 7 except that the substrate 210 having a surface which faces the first conductive semiconductor layer 124 and on which the uneven pattern 212 is formed is included.

Figure 9:
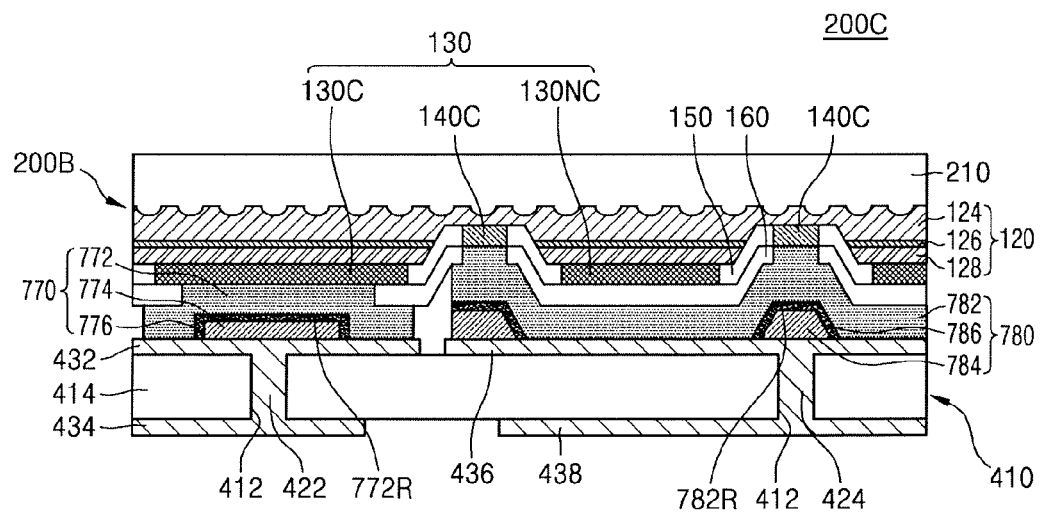
FIG. 9 is a cross-sectional view illustrating major elements of a semiconductor light-emitting device according to an embodiment of the inventive concept.

FIG. 9 is a cross-sectional view illustrating major elements of a semiconductor light-emitting device 200C according to an embodiment of the inventive concept. The semiconductor light-emitting device 200C has a structure in which the semiconductor light-emitting device 200B of FIG. 8 is mounted on the package substrate 410.

Figure 10:
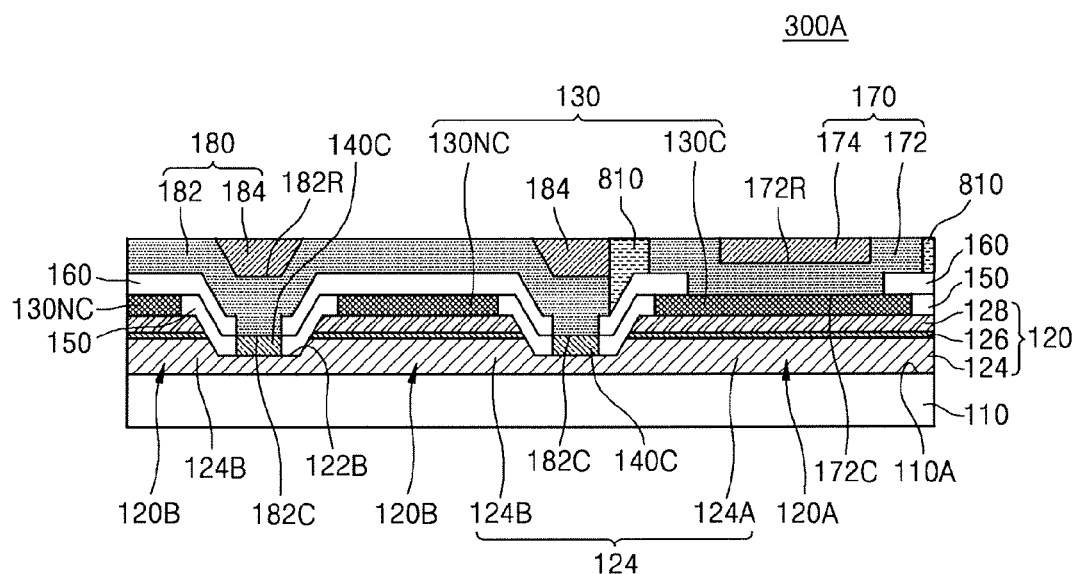
FIG. 10 is a cross-sectional view illustrating major elements of a semiconductor light-emitting device according to an embodiment of the inventive concept.

FIG. 10 is a cross-sectional view illustrating a semiconductor light-emitting device 300A according to an embodiment of the inventive concept. In FIG. 10, the same elements as those in FIG. 1B are denoted by the same reference numerals, and a detailed explanation thereof will not be given for briefness.

The semiconductor light-emitting device 300A includes, for example, a filling insulating layer 810 that covers parts of the first bonding conductive layer 170 and the second bonding conductive layer 180 on the same level as the first bonding conductive layer 170 and the second bonding conductive layer 180. As spaces between the first bonding conductive layer 170 and the second bonding conductive layer 180 are filled with the filling insulating layer 810, no empty spaces may exist between the first conductive layer 170 and the second bonding conductive layer 180.

In an embodiment, the filling insulating layer 810 may be formed of, for example, an oxide film, a nitride film, an insulating polymer, or a combination thereof. The insulating polymer may be formed by using, for example, inkjet printing, CVD, or PVD.

Figure 11:
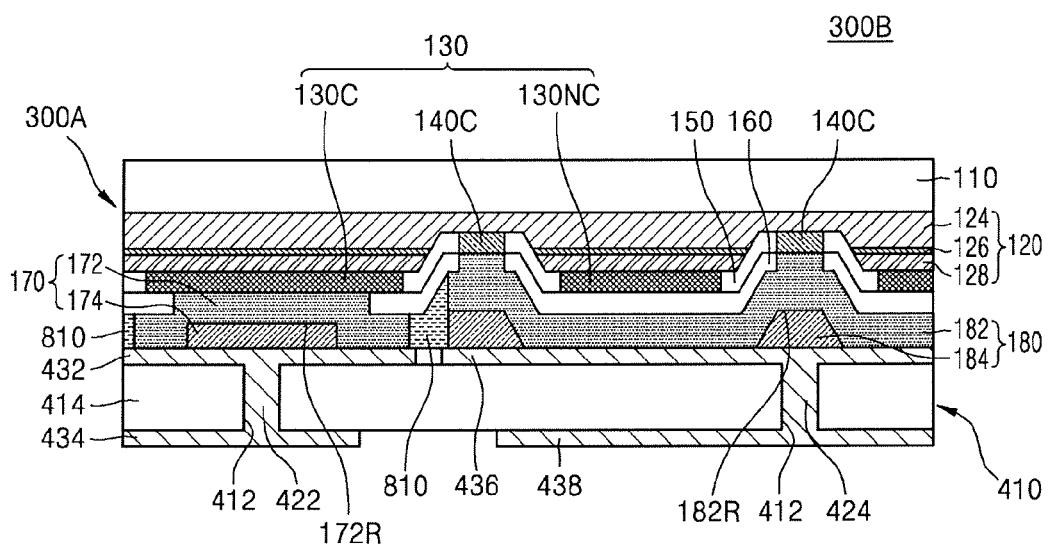
FIG. 11 is a cross-sectional view illustrating major elements of a semiconductor light-emitting device according to an embodiment of the inventive concept.

FIG. 11 is a cross-sectional view illustrating a semiconductor light-emitting device 300B according to an embodiment of the inventive concept. The semiconductor light-emitting device 300A has a structure in which the semiconductor light-emitting device 300A of FIG. 10 is mounted on the package substrate 410.

As spaces between the first bonding conductive layer 170 and the second bonding conductive layer 180 are filled with the filling insulating layer 810, after the semiconductor light-emitting device 300A is mounted on the package substrate 410, there hardly remain empty spaces between the semiconductor light-emitting device 300A and the package substrate 410. Accordingly, the risk of deterioration and contamination that may occur due to empty spaces between the semiconductor light-emitting device 300A and the package substrate 410 may be eliminated, thereby increasing reliability. Also, an interface between the semiconductor light-emitting device 300A and the package substrate 410 is planarized, thereby increasing adhesive characteristics.

Figure 12:
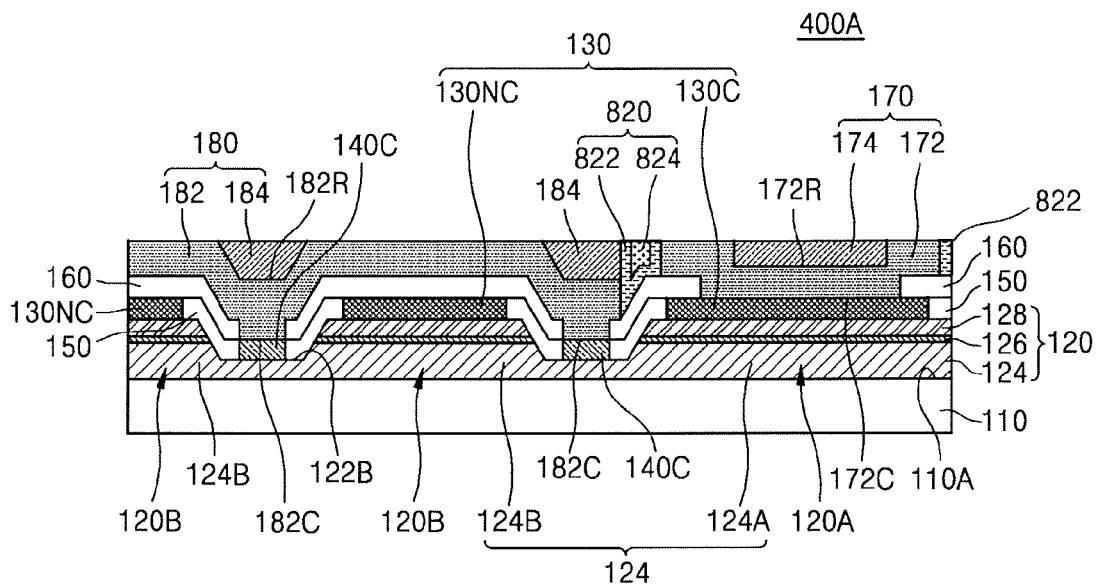
FIG. 12 is a cross-sectional view illustrating major elements of a semiconductor light-emitting device according to an embodiment of the inventive concept.

FIG. 12 is a cross-sectional view illustrating a semiconductor light-emitting device 400A according to an embodiment of the inventive concept. In FIG. 12, the same elements as those in FIG. 1B are denoted by the same reference numerals, and a detailed explanation thereof will not be given for briefness.

The semiconductor light-emitting device 400A includes, for example, a filling layer 820 that covers parts of the first bonding conductive layer 170 and the second bonding conductive layer 180 on the same level as the first bonding conductive layer 170 and the second bonding conductive layer 180. As spaces between the first bonding conductive layer 170 and the second bonding conductive layer 180 are filled with the filling layer 820, no empty spaces may exist between the first bonding conductive layer 170 and the second bonding conductive layer 180.

The filling layer 820 includes, for example, an insulating layer 822 that contacts and insulates the first bonding conductive layer 170 and the second bonding conductive layer 180, and a metal layer 824 that fills a recess area formed by the insulating layer 822 due to a stepped portion disposed thereunder. The insulating layer 822 may be formed to have, for example, a thickness great enough to obtain an insulating distance between the first bonding conductive layer 170 and the second bonding conductive layer 180.

In an embodiment, the insulating layer 822 may be formed of, for example, an oxide film, a nitride film, an insulating polymer, or a combination thereof. The insulating polymer may be formed by using, for example, inkjet printing, CVD, or PVD. The metal layer 824 may be formed of, for example, the same material as that of the first filling bonding layer 174 and the second filling bonding layers 184.

For example, in a method of manufacturing the semiconductor light-emitting device 400A, the insulating layer 822 of the filling layer 820 may be formed after the first main bonding layer 172 and the second main bonding layer 182 are formed, but before the first filling bonding layer 174 and the second filling bonding layers 184 are formed. Next, the metal layer 824 of the filling layer 820, the first filling bonding layer 174, and the second filling bonding layers 184 may be formed by using, for example, the same process. For example, each of the metal layer 824 of the filling layer 820, the first filling bonding layer 174, and the second filling bonding layers 184 may be formed of a metal or an alloy by using inkjet printing.

Figure 13:
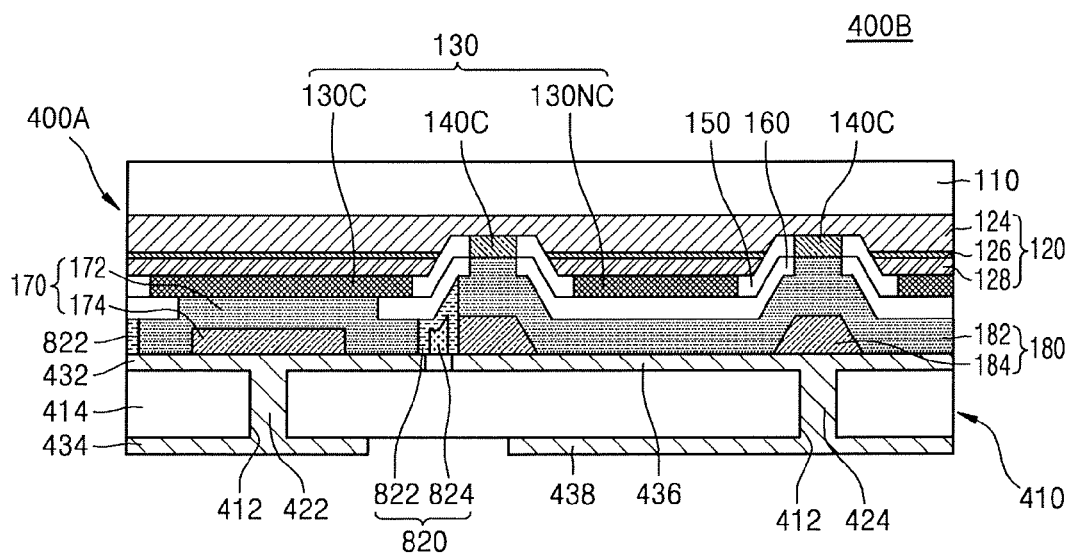
FIG. 13 is a cross-sectional view illustrating major elements of a semiconductor light-emitting device according to an embodiment of the inventive concept.

FIG. 13 is a cross-sectional view illustrating major elements of a semiconductor light-emitting device 400B according to an embodiment of the inventive concept. The semiconductor light-emitting device 400B has a structure in which the semiconductor light-emitting device 400A of FIG. 12 is mounted on the package substrate 410.

As the filling layer 820 includes the metal layer 824, a volume of a metal between the semiconductor light-emitting device 400A and the package substrate 410 is increased, thereby reducing heat resistance and increasing reliability.

Figure 14A:
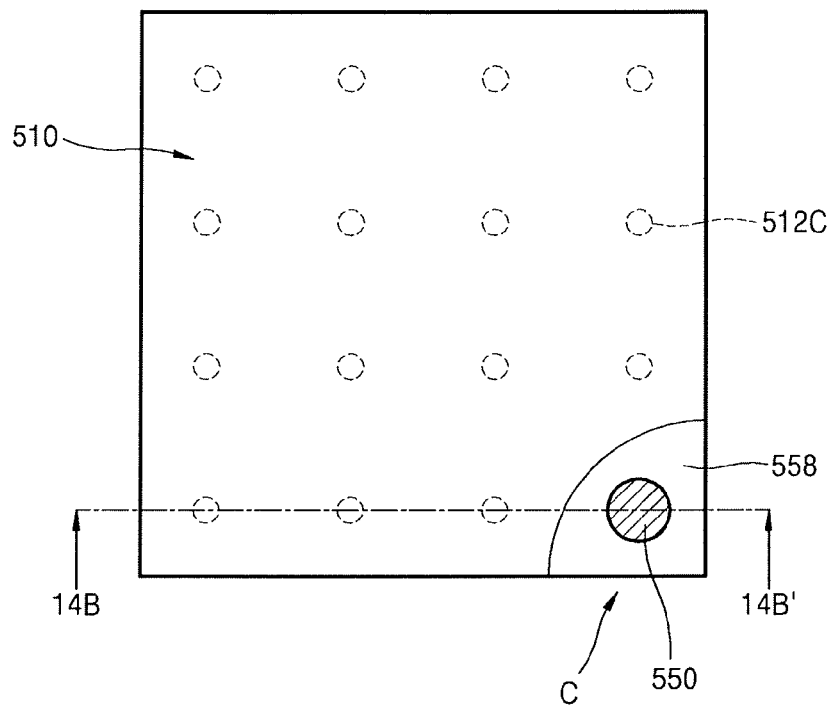
FIG. 14A is a plan view illustrating major elements of a semiconductor light-emitting device according to an embodiment of the inventive concept.
Figure 14B:
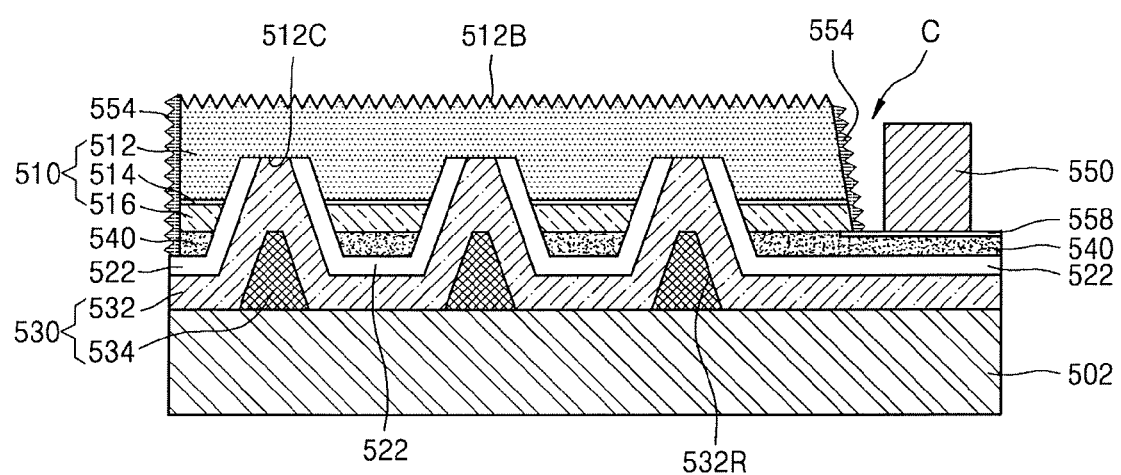
FIG. 14B is a cross-sectional view taken along line 14B-14B' of FIG. 14A.

FIG. 14A is a plan view illustrating major elements of a semiconductor light-emitting device 500 according to an embodiment of the inventive concept. FIG. 14B is a cross-sectional view taken along line 14B-14B' of FIG. 14A.

Referring to FIGS. 14A and 14B, the semiconductor light-emitting device 500 includes, for example, a conductive substrate 502, and a light-emitting structure 510 that is formed on the conductive substrate 502.

The conductive substrate 502 may be, for example, a metal substrate or a semiconductor substrate. In an embodiment, the conductive substrate 502 may include at least one of, for example, Au, Ni, Al, Cu, W, silicon (Si), selenium (Se), and gallium arsenide (GaAs). For example, the conductive substrate 502 may be a Si substrate doped with Al.

A part of the conductive substrate 502 is covered by the light-emitting structure 510. A connection area C not covered by the light-emitting structure 510 is disposed on the conductive substrate 502. Although the connection area C is disposed adjacent to a corner portion of the conductive substrate 502 in FIGS. 14A and 14B, the present embodiment is not limited thereto. For example, the connection area C may be formed on a central portion of the conductive substrate 502, or an arbitrary position between the central portion and an edge portion of the conductive substrate 502. Also, although the semiconductor light-emitting device 500 includes one connection area C in FIGS. 14A and 14B, the present embodiment is not limited thereto. For example, the semiconductor light-emitting device 500 may include at least two connection areas C.

The light-emitting structure 510 includes, for example, a first conductive semiconductor layer 512, an active layer 514, and a second conductive semiconductor layer 516. A first electrode layer 530 is connected to the first conductive semiconductor layer 512.

The first electrode layer 530 includes, for example, a first main electrode layer 532, and a filling bonding layer 534 that is formed on the first main electrode layer 532. The first main electrode layer 532 has, for example, a recess area 532R that is formed by a stepped portion on a surface facing the conductive substrate 502. The filling bonding layer 534 is formed in the recess area 532R. The first main electrode layer 532 and the filling bonding layer 534 have, for example, flat surfaces that extend on the same plane and face the conductive substrate 502. In an embodiment, the filling bonding layer 534 and the second filling bonding layers 184 described with reference to FIGS. 1A and 1B may, for example, have the same structure. Alternatively, in an embodiment, the filling bonding layer 534 may have, for example, the same stacked structure as that of the second filling bonding layers 784 and the second barrier layers 786 described with reference to FIG. 7.

A second electrode layer 540 is connected to the second conductive semiconductor layer 516. A side wall of the light-emitting structure 510 and a part of the second electrode layer 540 are covered by an insulating layer 522.

A portion of the first main electrode layer 532 passes through the insulating layer 522, the second electrode layer 540, the second conductive semiconductor layer 516, and the active layer 514 and extends to a plurality of contact areas 512C of the first conductive semiconductor layer 512. The first conductive semiconductor layer 512 and the conductive substrate 502 may be electrically connected to each other through the first main electrode layer 532. The first main electrode layer 532 and the light-emitting structure 510 may be, for example, insulated from each other by the insulating layer 522.

An uneven pattern having a regular shape or an irregular shape is formed on a surface 512B of the first conductive semiconductor layer 512 opposite to a surface facing the active layer 514. As the uneven pattern is formed on the surface 512B of the first conductive semiconductor layer 512, the amount of light emitted to the outside from among light generated by the active layer 514 is increased, thereby suppressing light loss and increasing brightness.

An electrode pad 550 for supplying external power to the second electrode layer 540 is formed in the connection area C of the second electrode layer 540. In an embodiment, to supply external power to the second electrode layer 540, a connection unit (not shown) such as, for example, a wire may be connected to the electrode pad 550.

Materials of the first conductive semiconductor layer 512, the active layer 514, the second conductive semiconductor layer 516, the first electrode layer 530, the insulating layer 522, and the second electrode layer 540 are, for example, the same as those of the first conductive semiconductor layer 124, the active layer 126, the second conductive semiconductor layer 128, the first electrode layer 130, the first insulating layer 150, and the second electrode layer 140 described with reference to FIGS. 1A and 1B.

A side wall of the light-emitting structure 510 is covered by a passivation layer 554. In an embodiment, the passivation layer 554 may be formed of, for example, an oxide, a nitride, an insulating polymer, or a combination thereof. In an embodiment, the passivation layer 554 may have a thickness ranging from, but is not limited to, about 0.1 to about 2 µm.

The passivation layer 554 may protect the light-emitting structure 510, such as, for example, the active layer 514, from the outside. As the passivation layer 554 is formed on a side wall of the light-emitting structure 510, the possibility that the active layer 514 acts as a leakage current path during an operation of the semiconductor light-emitting device 500 may be eliminated. The passivation layer 554 may have a surface on which an uneven pattern having a regular shape or an irregular shape is formed. As the uneven pattern is formed on the surface of the passivation layer 554, light extraction efficiency of the semiconductor light-emitting device 500 may be increased.

A protective film 558 is formed on a surface of the second electrode layer 540 facing the connection area C. The protective film 558 may be formed on the second conductive semiconductor layer 516, for example, before the second electrode layer 540 is formed on the second conductive semiconductor layer 516 during a process of manufacturing the semiconductor light-emitting device 500. The second electrode layer 540 may be formed on the second conductive semiconductor layer 516 and the protective film 558. During a process of forming the semiconductor light-emitting device 500, when semiconductor layers constituting the light-emitting structure 510 are etched to form the connection area C, the semiconductor layers may be etched by using, for example, the protective layer 558 as an etch-stop layer. Accordingly, as a process of etching the semiconductor layers may stop before the second electrode layer 540 is exposed in the connection area C, and the second electrode layer 540 is not exposed to an etching atmosphere, the difficulty in which a material of the second electrode layer 540 becomes attached to a surface of the active layer 514 that is exposed on a side wall of the light-emitting structure 510 through the connection area C may be solved.

Figure 15:
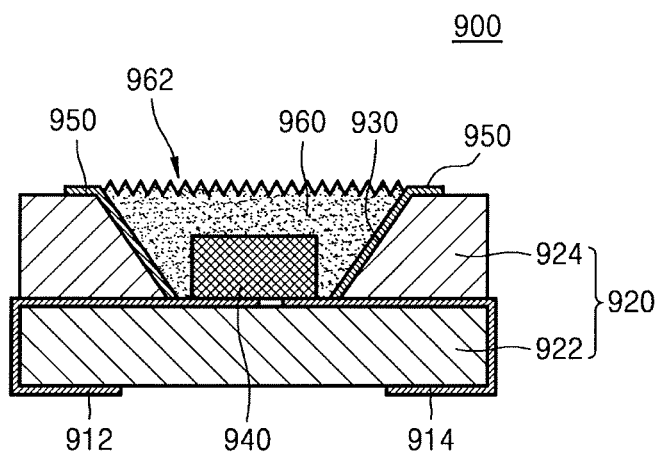
FIG. 15 is a cross-sectional view illustrating major elements of a semiconductor light-emitting device according to an embodiment of the inventive concept.

FIG. 15 is a cross-sectional view illustrating major elements of a semiconductor light-emitting device package 900 according to an embodiment of the inventive concept.

Referring to FIG. 15, the light-emitting device package 900 includes, for example, a cup-shaped package structure 920 on which electrode patterns 912 and 914 are formed. The package structure 920 includes, for example, a lower structure 922 having a surface on which the electrode patterns 912 and 914 are formed, and an upper substrate 924 having a groove portion 930.

A semiconductor light-emitting device 940 is mounted on a bottom surface of the groove portion 930 by using, for example, flip-chip technology. The semiconductor light-emitting device 940 may include, for example, at least one of the semiconductor light-emitting devices 100A, 100B, 200A, 200B, 300A, 400A, and 500 described with reference to FIGS. 1A, 1B, 2, 7, 8, 10, 12, 14A, and 14B. The semiconductor light-emitting device 940 may be fixed to the electrode patterns 912 and 914 by using, for example, eutectic die bonding.

A reflective plate 950 is formed on an inner wall of the groove portion 930. The semiconductor light-emitting device 940 is covered by a transparent resin 960 that fills the groove portion 930 on the reflective plate 950. An uneven pattern 962 for increasing light extraction efficiency is formed on a surface of the transparent resin 960. Alternatively, in an embodiment, the uneven pattern 962 may be omitted.

The light-emitting device package 900 may be used as, for example, a blue light-emitting diode (LED) having high output/high efficiency, and may be used in a large display device, an LED TV, an RGB white lighting device, or a dimming lighting device.

Figure 16:
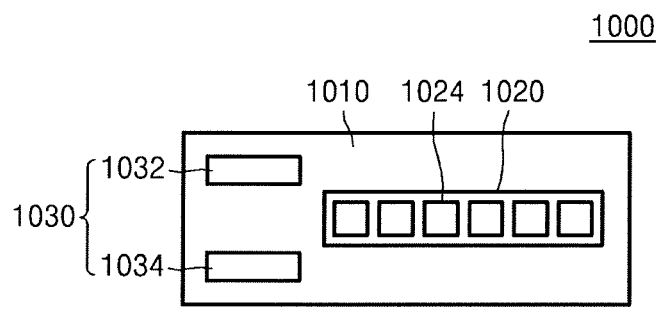
FIG. 16 is a view illustrating a dimming system including a semiconductor light-emitting device, according to an embodiment of the inventive concept.

FIG. 16 is a view illustrating a dimming system 1000 including a semiconductor light-emitting device, according to an embodiment of the inventive concept.

Referring to FIG. 16, the dimming system 1000 includes, for example, a light-emitting module 1020, and a power supply unit 1030 that is disposed on a structure 1010.

The light-emitting module 1020 includes, for example, a plurality of light-emitting device packages 1024. The plurality of light-emitting device packages 1024 may include, for example, at least one of the semiconductor light-emitting devices 100A, 100B, 100C, 100D, 100E, 200A, 200B, 200C, 300A, 300B, 400A, 400B, and 500 described with reference to FIGS. 1A, 1B, 2, and 4 through 14B.

The power supply unit 1030 includes, for example, an interface 1032 to which power is input, and a power supply control unit 1034 that controls power supplied to the light-emitting module 1020. The interface 1032 may include, for example, a fuse that cuts off over-current, and an electromagnetic shielding filter that shields an electromagnetic interference signal. The power supply control unit 1034 may include, for example, a rectification unit and a smoothing unit that convert input alternating current power into direct current power, and a constant voltage control unit that converts a voltage into a voltage suitable for the light-emitting module 1020. The power supply unit 1030 may include, for example, a feedback circuit device that compares the amount of light emitted by the plurality of light-emitting device packages 1024 with a preset amount of light, and a memory device that stores information such as desired brightness or color rendition.

The dimming system 1000 may be used as, for example, an indoor illumination device of a backlight unit, a lamp, or a flat panel lighting device used for a display device such as a liquid crystal display (LCD) device including an image panel, or as an outdoor lighting device of a signboard or a road sign. Alternatively, in an embodiment, the dimming system 1000 may be used as, for example, a lighting device for a transportation unit such as a vehicle, a ship, or an airplane, or an electric appliance such as a TV or a fridge, or a medical device.

Figure 17:
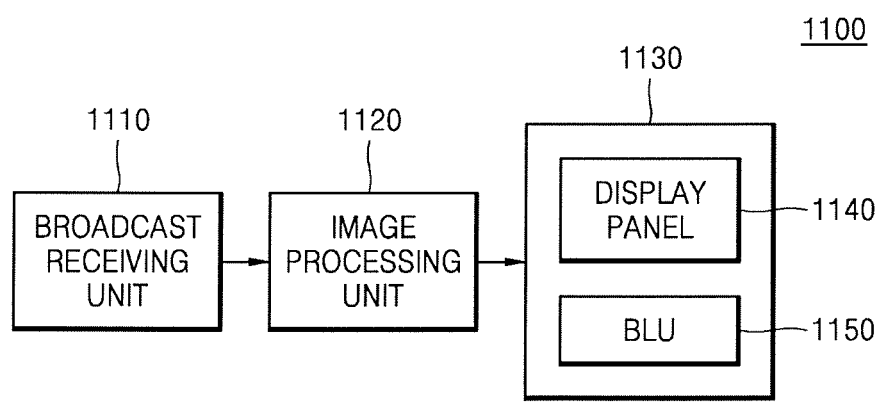
FIG. 17 is a block diagram illustrating a display apparatus including a semiconductor light-emitting device, according to an embodiment of the inventive concept.

FIG. 17 is a block diagram illustrating a display device 1100 including a semiconductor light-emitting device, according to an embodiment of the inventive concept.

Referring to FIG. 17, the display device 1100 includes, for example, a broadcast receiving unit 1110, an image processing unit 1120, and a display unit 1130.

The display unit 1130 includes, for example, a display panel 1140 and a backlight unit (BLU) 1150. The BLU 1150 includes, for example, light sources that generate light and driving elements that drive the light sources.

The broadcast receiving unit 1110 is for selecting a channel of a broadcast signal received in a wired or wireless manner through a cable or the air, sets an arbitrary channel from among a plurality of channels as an input channel, and receives a broadcast signal through the input channel.

The image processing unit 1120 performs signal processing such as, for example, video decoding, video scaling, or frame rate conversion (FRC) on broadcast content output from the broadcast receiving unit 1110.

The display panel 1140 may include, but is not limited to, an LCD. The display panel 1140 displays the broadcast content on which signal processing has been performed by the image processing unit 1120. The BLU 1150 projects light to the display panel 1140 so that an image is displayed on the display panel 1140. The BLU 1150 may include, for example, at least one of the semiconductor light-emitting devices 100A, 100B, 100C, 100D, 100E, 200A, 200B, 200C, 300A, 300B, 400A, 400B, and 500 described with reference to FIGS. 1A, 1B, 2, and 4 through 14B.

A semiconductor light-emitting device according to the inventive concept has a structure in which a recess area formed in a main bonding layer on a top surface of which stepped portions are formed due to stepped portions of structures disposed under the main bonding layer is filled with a filling bonding layer. Accordingly, empty spaces between a bonding conductive layer and a package substrate are minimized and an interface between the bonding conductive layer and the package substrate is planarized, thereby increasing adhesive characteristics. The risk of deterioration and contamination that may occur due to the empty spaces is eliminated, thereby increasing reliability. Also, as the filling bonding layer includes a metal, a volume of a metal in a bonding area is increased and heat resistance is reduced, thereby increasing reliability.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A semiconductor light-emitting device comprising:
   a light-emitting structure comprising a first conductive semiconductor layer, an active layer, and a second conductive semiconductor layer;
   an electrode layer contacting one of the first conductive semiconductor layer and the second conductive semiconductor layer; and
   a bonding conductive layer connected to the electrode layer,
   wherein the bonding conductive layer comprises: a conductive main bonding layer having a recess area defined by a stepped portion on a surface opposite to a surface facing the electrode layer; and
   a conductive filling bonding layer filling at least a part of the recess area,
   wherein the semiconductor light-emitting device further comprises a filling insulating layer covering a part of the bonding conductive layer on a same level as the bonding conductive layer, and
   wherein the filling insulating layer comprises an insulating layer that contacts and insulates the bonding conductive layer, and a metal layer that fills a recess in the insulating layer defined by a stepped portion of the insulating layer under the recess.

2. The semiconductor light-emitting device of claim 1, wherein the conductive main bonding layer and the conductive filling bonding layer comprise different materials from each other.

3. The semiconductor light-emitting device of claim 1, wherein the conductive main bonding layer and the conductive filling bonding layer have substantially flat surfaces that extend on a same plane as each other and are opposite to surfaces facing the electrode layer.

4. The semiconductor light-emitting device of claim 1, further comprising a conductive barrier layer disposed between the conductive main bonding layer and the conductive filling bonding layer in the recess area.

5. The semiconductor light-emitting device of claim 1, wherein each of the conductive main bonding layer and the conductive filling bonding layer comprise a material selected from the group consisting of gold (Au), tin (Sn), nickel (Ni), lead (Pb), silver (Ag), indium (In), chromium (Cr), germanium (Ge), silicon (Si), titanium (Ti), tungsten (W), platinum (Pt), or a combination thereof.

6. The semiconductor light-emitting device of claim 1, wherein the conductive main bonding layer comprises a material selected from the group consisting of gold (Au), tin (Sn), nickel (Ni), lead (Pb), silver (Ag), indium (In), chromium (Cr), germanium (Ge), silicon (Si), titanium (Ti), tungsten (W), platinum (Pt), or a combination thereof, and the conductive filling bonding layer is formed of a conductive polymer.

7. A semiconductor light-emitting device comprising:
   a package substrate;
   a first conductive semiconductor layer comprising grooves disposed in a surface facing the package substrate such that a plurality of mesa areas having a plurality of branching portions spaced apart from one another are defined;
   an active layer disposed on the plurality of mesa areas;
   a second conductive semiconductor layer disposed on the active layer;
   a first electrode layer connected to the second conductive semiconductor layer, on the plurality of mesa areas;
   a second electrode layer connected to the first conductive semiconductor layer, on bottom surfaces of the grooves; and
   a bonding conductive layer disposed between the package substrate and at least one of the first electrode layer and the second electrode layer,
   wherein the bonding conductive layer comprises:
   a main bonding layer having a contact surface contacting the at least one electrode layer, a mount surface opposite to the contact surface, and at least one recess area defined by stepped portions in the mount surface; and
   a filling bonding layer filling the at least one recess area.

8. The semiconductor light-emitting device of claim 7, wherein the second electrode layer comprises a plurality of contact areas contacting the main bonding layer.

9. The semiconductor light-emitting device of claim 8, wherein the at least one recess area comprises a plurality of recess areas disposed to correspond to the plurality of contact areas of the second electrode layer, wherein the filling bonding layer is formed in each of a plurality of spaces defined by the package substrate and the plurality of recess areas.

10. The semiconductor light-emitting device of claim 7, wherein the main bonding layer comprises a first portion covering a part of the first electrode layer with an insulating layer therebetween, and a second portion contacting the second electrode layer and covering the second electrode layer, and wherein the filling bonding layer is disposed vertically overlapping with the second electrode layer.

11. The semiconductor light-emitting device of claim 7, wherein the package substrate comprises a first conductive layer and a second conductive layer spaced apart from each other, wherein each of the main bonding layer and the filling bonding layer contacts at least one of the first conductive layer and the second conductive layer.

12. The semiconductor light-emitting device of claim 7, further comprising a conductive barrier layer disposed between the main bonding layer and the filling bonding layer in the at least one recess area, wherein the conductive barrier layer comprises a portion contacting the package substrate.

13. The semiconductor light-emitting device of claim 7, wherein the main bonding layer comprises an alloy of nickel (Ni) and tin (Sn), and the filling bonding layer comprises an alloy of gold (Au) and Sn.

14. The semiconductor light-emitting device of claim 7, further comprising a filling insulating layer that contacts the package substrate around the bonding conductive layer.

15. The semiconductor light-emitting device of claim 7, wherein the first conductive semiconductor layer includes an uneven surface facing away from the package substrate.

16. A semiconductor light-emitting device comprising:
- a substrate having an uneven pattern disposed on a first surface thereof;
- a first conductive semiconductor layer disposed on the uneven pattern on the first surface of the substrate, wherein the first conductive semiconductor layer comprises a plurality of grooves therein, a first mesa area that constitutes part of a first mesa structure, and a plurality of second mesa areas constituting a plurality of second mesa structures branching from the first mesa structure and wherein the second mesa areas have a plurality of branching portions which are spaced apart from one another by the grooves disposed therebetween;
- an active layer disposed on the first mesa area and the second mesa areas;
- a second conductive semiconductor layer disposed on the active layer;
- a first electrode layer connected to the second conductive semiconductor layer and overlapping with first mesa area and the second mesa areas;
- a second electrode layer extending in a longitudinal direction of the grooves on bottom surfaces of the grooves, wherein the second electrode layer includes a plurality of contacts disposed on the bottom surfaces of the grooves which connect the second electrode layer to the first conductive semiconductor layer;
- a first insulating layer covering sidewalls of the first mesa structure and the second mesa structures branching from the first mesa structure;
- a second insulating layer covering the sidewalls of the first mesa structure and the second mesa structures branching from the first mesa structure with the first insulating layer therebetween and covering a non-contact area of the first electrode layer; a first bonding conductive layer disposed on the first electrode layer and overlapping with the first mesa structure and connected to the first electrode layer via a contact area of the first electrode layer, wherein the first bonding conductive layer includes a first main bonding layer having a first recess area therein defined by a stepped portion in a surface opposite to a contact surface of the first main bonding layer contacting the first electrode layer, and a first filling bonding layer filling in the first recess area of the first main bonding layer; and
- a second bonding conductive layer disposed on the second electrode layer and connected to the second electrode layer through the plurality of contacts of the second electrode layer, wherein the second bonding conductive layer includes a second main bonding layer having a plurality of second recess areas disposed in a surface opposite to a surface facing the second electrode layer and defined by a stepped portion of the second mesa structures, and a plurality of second filling bond layers filling the second recess areas.

17. The semiconductor light-emitting device of claim 16, wherein the first main bonding layer and the second main bonding layer each comprise a material selected from the group consisting of gold (Au), tin (Sn), nickel (Ni), lead (Pb), silver (Ag), indium (In), chromium (Cr), germanium (Ge), silicon (Si), titanium (Ti), tungsten (W), platinum (Pt), or a combination thereof, and wherein the filling bonding layer is formed of a conductive polymer selected from the group consisting of polyacetylene, polyaniline, polypyrrole, polythiophene, poly sulfur nitride, poly(2- or 3-alkylthiophene), polyphenylene, polyphenylene sulfide, polyisothiannaphthene, polyazulene, polyfuran, poly(phenylenevinylene), poly(thienylene-vinylene) or a combination thereof.

18. The semiconductor light-emitting device of claim 16, wherein the second bonding conductive layer contacts the contact areas of the second electrode layer and the second insulating layer over the second mesa structures, and wherein the second bonding conductive layer overlaps with the second mesa structures.

* * * * *